United States Patent [19]

Narazaki et al.

[11] Patent Number: 5,545,573
[45] Date of Patent: Aug. 13, 1996

[54] METHOD OF FABRICATING INSULATED GATE SEMICONDUCTOR DEVICE

[75] Inventors: Atsushi Narazaki; Yoshiaki Hisamoto, both of Fukuoka, Japan

[73] Assignee: Mitsubishi Denki Kabushiki Kaisha, Tokyo, Japan

[21] Appl. No.: 450,778

[22] Filed: May 25, 1995

[30] Foreign Application Priority Data

Jun. 1, 1994 [JP] Japan .................................. 6-120150

[51] Int. Cl.⁶ ................................................ H01L 21/265
[52] U.S. Cl. .............................. 437/40; 437/41; 437/228; 437/50; 437/29; 437/913; 556/651.1
[58] Field of Search ....................... 437/40 DM, 41 DM, 437/40 GS, 41 GS, 44, 228, 29, 50, 195, 187, 913; 156/650.1, 651.1

[56] References Cited

U.S. PATENT DOCUMENTS

| | | | |
|---|---|---|---|
| 4,948,743 | 8/1990 | Ozaki | 437/228 |
| 4,970,173 | 11/1990 | Robb | 437/40 DM |
| 5,034,336 | 7/1991 | Seki | 437/29 |
| 5,164,327 | 11/1992 | Maruyama | 437/40 DM |
| 5,250,449 | 10/1993 | Kuroyanagi et al. | 437/29 |
| 5,374,571 | 12/1994 | Mukherjee et al. | 437/29 |
| 5,404,040 | 4/1995 | Hshieh et al. | 437/913 |

FOREIGN PATENT DOCUMENTS

| | | | |
|---|---|---|---|
| 0283169 | 12/1986 | Japan | 437/40 DM |
| 0073564 | 4/1988 | Japan | 437/40 DM |

*Primary Examiner*—Trung Dang
*Attorney, Agent, or Firm*—Oblon, Spivak, McClelland, Maier & Neustadt, P.C.

[57] ABSTRACT

In order to prevent an etch-down phenomenon in a gate electrode (106), a source electrode (108) is connected to an upper major surface of a semiconductor substrate (160) through openings (112, 112a) of a protective film (107), while a gate wire (109) is connected to the gate electrode (106) through an opening (111). The opening (112, 112a) are formed by dry etching, whereby the source electrode (108) is reliably insulated from the gate electrode (106). On the other hand, the opening (111) is formed by wet etching, whereby the gate electrode (106) is not etched down. Thus, it is possible to prevent short-circuiting defectiveness across the gate electrode (106) and the semiconductor substrate (160) resulting from an etch-down phenomenon of the gate electrode (106) while guaranteeing electrical insulation between the gate electrode (106) and the source electrode (108).

25 Claims, 39 Drawing Sheets

METHOD OF FABRICATING INSULATED GATE SEMICONDUCTOR DEVICE

BACKGROUND OF THE INVENTION

1. Field of the Invention

The present invention relates to a method of fabricating an insulated gate semiconductor device such as an MOSFET, for example, and more particularly, it relates to an improvement for preventing an etch-down phenomenon in a gate electrode.

2. Background of the Invention

An insulated gate semiconductor device has such a structure that p-type and n-type semiconductor layers are alternately connected with each other so that main electrodes which are fed with a main current are connected to endmost semiconductor layers and a gate electrode for forming a channel by application of an electric field is connected to at least one semiconductor layer through an insulating film. In this insulated gate semiconductor device, the main current flowing across the two main electrodes is controlled by a voltage which is applied to the gate electrode. Typical examples of such a semiconductor device are a MOSFET (MOS field effect transistor) and an IGBT (insulated gate bipolar transistor).

In the insulated gate semiconductor device, a number of elements having the same structure (hereinafter referred to as unit cells) are generally connected in parallel with each other. Such a structure is particularly preferable in a power insulated gate semiconductor device.

FIG. 37 is a plan view typically showing a part of a MOSFET 50 which is known in general, and FIG. 38 is a sectional view taken along the line X—X in FIG. 37. In this MOSFET 50, a number of unit cells are arranged on both sides of a gate wire 9 in the form of a matrix. FIGS. 37 and 38 illustrate the gate wire 9 and the unit cells which are adjacent thereto.

In this MOSFET 50, an n⁻-type semiconductor layer 2 containing an n-type impurity of low concentration is formed on a semiconductor substrate structuring an n⁺-type semiconductor layer 1 containing an n-type impurity in high concentration, while p base layers 3 and a p well 3a are selectively formed by selectively diffusing a p-type impurity in an upper major surface portion of the n⁻-type semiconductor layer 2. The p base layers 3 are formed for the respective unit cells, while the p well 3a is formed immediately under the gate wire 9.

Further, n⁺ emitter layers 4 are selectively formed on upper major surfaces of the p base layers 3 by selectively diffusing an n-type impurity of high concentration. A flat plate type semiconductor substrate 60 is formed by these five types of semiconductor layers. A gate electrode 6 consisting of polysilicon is arranged on an upper major surface of the semiconductor substrate 60 consisting of silicon, through a gate insulating film 5 which is formed by a silicon oxide film. FIG. 37 shows the gate electrode 6 in a hatched manner.

The gate electrode 6 is provided with an opening (gate opening) 13 every unit cell, so that its opening edge is positioned immediately above the outer edge of each n⁺ emitter layer 4 or somewhat inwardly. Namely, the gate electrode 6 is so arranged as to cover an upper surface portion of each p base layer 3 which is held between each n⁺ emitter layer 4 and the n⁻ semiconductor layer 2, i.e., a channel region 61, in each unit cell.

The gate electrode 6 is covered with a protective film 7 which is formed by a silicon oxide film. This protective film 7 is provided with openings 13 inside the gate openings 13. Source electrodes 8 are connected to upper surfaces of the n⁺ emitter layers 4 and those of the p base layers 3 held between the n⁺ emitter layers 4 for the respective unit cells. The source electrodes 8 are electrically insulated from the gate electrode 6 by the protective film 7.

The protective film 7 is further provided with an opening 11 in a position corresponding to that immediately above the p well 3a. The aforementioned gate wire 9 is connected to the gate electrode 6 through the opening 11. This gate wire 9 is electrically insulated from the source electrodes 8. Both of the source electrodes 8 and the gate wire 9 are made of conductive Al-Si (solid solution of aluminum and silicon). A drain electrode 10 consisting of conductive Ti/Ni/Au (alloy containing titanium, nickel and gold) is formed on a lower major surface of the semiconductor substrate 60, i.e., that of the n⁺-type semiconductor layer 1.

In order to use this MOSFET 50, a drain voltage $V_{DS}$ is first positively applied across the drain electrode 10 and the source electrodes 8, by connecting an external power source. In this state, a gate voltage $V_{GS}$ exceeding a prescribed gate threshold voltage $V_{GS(th)}$ is positively applied across the gate electrode 6 and the source electrodes 8 through the gate wire 9 (namely, the gate is turned on), so that the p-type channel regions 61 which are parts of the p base layers 3 are reversed to n types, whereby n-type channels are formed in the channel regions 61. The n⁺ emitter layers 4 and the n⁻-type semiconductor layer 2 conduct by these channels. Consequently, the main current flows from the drain electrode 10 to the source electrodes 8. Namely, the MOSFET 50 conducts.

Then, the gate voltage $V_{GS}$ is returned to a zero or minus (reverse bias) value (namely, the gate is turned off), so that the channels formed in the channel regions 61 disappear and the channel regions 61 are restored to the original p conductivity type. Consequently, the n⁺ emitter layers 4 are disconnected from the n⁻-type semiconductor layer 2, whereby no main current flows. Namely, the MOSFET 50 enters a nonconducting state.

This MOSFET 50 is generally fabricated in the following steps: Namely, the semiconductor substrate 60 is prepared so that the gate insulating film 5 and the gate electrode 6 are formed on the upper surface thereof, and thereafter the protective film 7 is temporarily formed to cover all these elements. Thereafter the openings 11 and 12 are simultaneously formed in the protective film 7 by photolithography. Then, an Al-Si layer is deposited by sputtering or vapor deposition to entirely cover the openings 11 and 12 and the protective film 7. Thereafter the Al-Si layer is selectively removed by photolithography, thereby forming the source electrodes 8 and the gate wire 9.

In the aforementioned conventional fabrication steps, the openings 11 and 12 are formed in the protective film 7 by dry etching. When the dry etching is employed, there is no possibility that the openings 12 are unnecessarily enlarged by side etching. Thus, it is possible to reliably ensure the insulation between the source electrodes 8 and the gate electrode 6, thereby attaining an effect of reducing the percentage defective of products resulting from defective insulation in these portions. This effect is particularly important when the unit cells are refined, and the importance is particularly increased when the widths of the openings 12 are not more than 0.8 μm, for example.

As shown in a front sectional view of FIG. 39, further, it is possible to etch down the upper surface of the semiconductor substrate 60 to a proper depth (T in FIG. 39) in each opening 12 by employing dry etching. Thus, an action of extracting carriers remaining in the p base layer 3 appears and hence the speed (switching speed) in a switching operation is effectively increased. Further, another action of suppressing conduction of parasitic bipolar transistors which are unavoidably formed in the semiconductor substrate 60 so appears that it is possible to suppress breaking of the MOSFET 50 caused by a latch-up phenomenon.

Due to the employment of the dry etching, however, the conventional method of fabricating the MOSFET 50 has other problems.

First, the etching so excessively progresses in the opening 11 due to the employment of the dry etching that the gate electrode 6 may be unnecessarily etched down (in a portion S shown in FIG. 39). The gate electrode 6 is disadvantageously reduced in thickness due to such an unnecessary etch-down phenomenon, leading to retardation in switching speed of the MOSFET 50.

Second, the etch-down phenomenon in the opening 11 disadvantageously reaches the gate insulating film 5 to cause defective electrical insulation by the gate insulating film 5, leading to short-circuiting across the gate electrode 6 and the semiconductor substrate 60. Consequently, the percentage defective of the MOSFET 50 is disadvantageously increased by the defective insulation.

SUMMARY OF THE INVENTION

According to a first aspect of the present invention, a method of fabricating an insulated gate semiconductor device comprises (a) a step of preparing a semiconductor substrate having a major surface and a p-n junction, (b) a step of forming a gate electrode having a first opening on the major surface through an insulating film, (c) a step of forming an electrical insulating protective film to cover the gate electrode and the first opening, (d) a step of selectively carrying out dry etching on the protective film, thereby providing the protective film with a second opening which is defined on the major surface inside the first opening, (e) a step of selectively carrying out wet etching on the protective film with an etchant having substantially no etching action on the gate electrode, thereby providing the protective film with a third opening which is defined on the gate electrode, (f) a step of connecting a main electrode to the major surface through the second opening, and (g) a step of connecting a gate wire to the gate electrode through the third opening.

In the fabrication method according to the first aspect of the present invention, the second opening is formed by dry etching, whereby the same is not unnecessarily enlarged. Thus, the main electrode and the gate electrode are reliably electrically insulated from each other by the protective film separating the second opening and the gate electrode from each other, whereby it is possible to reduce the percentage of defectiveness resulting from defective insulation in these portions.

Further, the third opening is formed by the wet etching employing an etchant not substantially acting on the gate electrode, whereby the gate electrode is not etched down. Thus, it is possible to prevent reduction of the switching rate resulting from increase of electric resistance in the gate electrode caused by an etch-down phenomenon thereof. Further, no etch-down phenomenon is exerted on the insulating film, whereby it is possible to prevent the product from defectiveness resulting from short-circuiting across the gate wire and the semiconductor substrate.

Namely, it is possible to effectively eliminate inconvenience resulting from an etch-down phenomenon of the gate electrode while guaranteeing electrical insulation between the gate electrode and the main electrode according to the inventive method.

Preferably, the step (d) comprises (d-1) a step of forming a resist film on the protective film, (d-2) a step of selectively removing a portion of the resist film covering a central portion of the first opening through photolithography, (d-3) a step of carrying out dry etching on the protective film after the step (d-2) by employing the resist film as a screen, and (d-4) a step of removing the resist film.

Preferably, the dry etching is carried out through RIE.

Preferably, step (e) comprises (e-1) a step of forming a resist film on the protective film, (e-2) a step of selectively removing a portion of the resist film covering a prescribed portion of the gate electrode through photolithography, (e-3) a step of carrying out wet etching on the protective film after the step (e-2) by employing the resist film as a screen and employing an etchant having substantially no etching action with respect to the gate electrode, and (e-4) a step of removing the resist film.

Preferably, the protective film substantially consists of the same material as the insulating film.

Preferably, the semiconductor substrate consists of a semiconductor which is prepared from a base material of silicon, and each of the insulating film and the protective film substantially consists of a silicon oxide.

Preferably, the gate electrode substantially consists of polycrystalline silicon.

Preferably, the etchant consists of a hydrofluoric acid substance.

According to a second aspect of the present invention, the dry etching is carried out until the major surface is etched down in the step (d) in the fabrication method according to the first aspect of the present invention.

In the fabrication method according to the second aspect of the present invention, the major surface of the semiconductor substrate is etched down in the second opening, whereby an insulated gate semiconductor device having a high switching rate can be obtained while it is possible to suppress a latch-up phenomenon resulting from conduction of a parasitic bipolar transistor. In particular, increase of the gate resistance resulting from an etch-down phenomenon of the gate electrode is prevented, whereby an etch-down phenomenon of the semiconductor substrate effectively contributes to increase of the switching rate.

According to a third aspect of the present invention, a method of fabricating an insulated gate semiconductor device comprises (a) a step of preparing a semiconductor substrate having a major surface and a p-n junction, (b) a step of forming a gate electrode having a first opening on the major surface through an insulating film, (c) a step of forming an electrical insulating protective film to cover the gate electrode and the first opening, (d) a step of providing the protective film with a second opening which is defined on the major surface inside the first opening, (e) a step of providing the protective film with a third opening which is defined on the gate electrode, (f) a step of connecting a main electrode to the major surface through the second opening, and (g) a step of connecting a gate wire to the gate electrode through the third opening, while dry etching is selectively carried out through a single resist pattern for simultaneously forming the second and third openings, shapes and areas of pattern portions for the second and third openings are so set in the resist pattern as to expose the major surface in the second opening simultaneously with or before exposure of the gate electrode in the third opening, and the dry etching is stopped at a time of exposure of the gate electrode in the third opening.

In the fabrication method according to the third aspect of the present invention, the second opening is formed by dry etching, whereby the same is not unnecessarily enlarged. Thus, the main electrode and the gate electrode are reliably electrically insulated from each other by the protective film separating the second opening and the gate electrode from each other, whereby it is possible to reduce the percentage of defectiveness resulting from defective insulation in these portions.

While the third opening is also formed by dry etching simultaneously with the second opening, the point of time for just-etching the second opening is not delayed from that for just-etching the third opening by an action of a loading effect since the shapes and the areas of the pattern portions for the second and third openings are properly set in the resist pattern. Further, the dry etching is stopped at a point of time when the third opening is just-etched, whereby no etch-down phenomenon is caused on the gate electrode in the third opening, while the semiconductor substrate is reliably exposed in the second opening.

Since the gate electrode is not etched down, it is possible to prevent reduction of the switching rate resulting from increase in electric resistance of the gate electrode. Further, no etch-down phenomenon is exerted on the insulating film, whereby it is possible to prevent the product from defectiveness resulting from short-circuiting across the gate wire and the semiconductor substrate.

Namely, it is possible to effectively eliminate inconvenience resulting from an etch-down phenomenon of the gate electrode while guaranteeing electrical insulation between the gate electrode and the main electrode according to the inventive method. In addition, the second and third openings are simultaneously formed through the single resist pattern, whereby the fabrication steps are simple and the fabrication cost can be effectively reduced.

Preferably, the dry etching is carried out through RIE.

Preferably, the protective film substantially consists of the same material as said insulating film.

Preferably, the semiconductor substrate consists of a semiconductor which is prepared from a base material of silicon, and each of the insulating film and the protective film substantially consists of a silicon oxide.

Preferably, the gate electrode substantially consists of polycrystalline silicon.

According to a fourth aspect of the present invention, the shapes and the areas of said pattern portions are so set as to expose the major surface in the second opening before exposure of the gate electrode in the third opening in the fabrication method according to the third aspect of the present invention.

In the fabrication method according to the fourth aspect of the present invention, the shapes and areas of the pattern portions for the second and third openings are so set that the third opening is just-etched in advance of the second opening, whereby an etch-down phenomenon is being caused on the semiconductor substrate in the second opening when the third opening is just-etched. Thus, an insulated gate semiconductor device having a high switching rate is obtained while a latch-up phenomenon resulting from conduction of a parasitic bipolar transistor is suppressed. In particular, increase of gate resistance resulting from an etch-down phenomenon of the gate electrode is prevented, whereby an etch-down phenomenon of the semiconductor substrate effectively contributes to increase of the switching rate.

According to a fifth aspect of the present invention, a method of fabricating an insulated gate semiconductor device comprises (a) a step of preparing a semiconductor substrate having a major surface and a p-n junction, (b) a step of forming a gate electrode having a first opening on the major surface through an insulating film, (c) a step of forming an electrical insulating protective film to cover the gate electrode and the first opening, (d) a step of providing the protective film with a second opening which is defined on the major surface inside the first opening, (e) a step of providing the protective film with a third opening which is defined on the gate electrode, (f) a step of connecting a main electrode to the major surface through the second opening, and (g) a step of connecting a gate wire to the gate electrode through the third opening, while etching is selectively carried out through the same resist pattern for simultaneously forming the second and third openings, the etching is first carried out through dry etching, the dry etching is stopped immediately before exposure of the gate electrode in the third opening, and thereafter the etching is carried out through wet etching.

In the fabrication method according to the fifth aspect of the present invention, the second and third openings are first formed by dry etching, while this dry etching is stopped immediately before the third opening is just-etched, so that wet etching is thereafter employed. Therefore, no etch-down phenomenon is caused on the gate electrode in the third opening. Further, the second opening is not unnecessarily enlarged since the same is mainly formed by dry etching.

Since the gate electrode is not etched down, it is possible to prevent reduction of the switching rate resulting from increase in electric resistance of the gate electrode. Further, no etch-down phenomenon is exerted on the insulating film, whereby it is possible to prevent the product from defectiveness resulting from short-circuiting across the gate wire and the semiconductor substrate. In addition, the second opening is not unnecessarily enlarged, whereby the main electrode and the gate electrode are reliably electrically insulated from each other by the protective film separating the second opening and the gate electrode from each other. Consequently, it is possible to reduce the percentage of defectiveness resulting from defective insulation in these portions.

Namely, it is possible to effectively eliminate inconvenience resulting from an etch-down phenomenon of the gate electrode while guaranteeing electrical insulation between the gate electrode and the main electrode according to the inventive method. In addition, the second and third openings are simultaneously formed through the same resist pattern, whereby the fabrication steps are simple and the fabrication cost can be effectively reduced.

Preferably, the dry etching is carried out through RIE.

Preferably, the protective film substantially consists of the same material as the insulating film.

Preferably, the semiconductor substrate consists of a semiconductor which is prepared from a base material of silicon, and each of the insulating film and the protective film substantially consists of a silicon oxide.

Preferably, the gate electrode substantially consists of polycrystalline silicon.

Preferably, the etchant consists of a hydrofluoric acid substance.

Preferably, the dry etching is stopped when the thickness of the protective film in the third opening reaches a level in the range of about 0.01 μm to about 0.02 μm.

According to a sixth aspect of the present invention, wet etching employing the resist pattern is additionally carried out in the etching in advance of the dry etching in the fabrication method according to the fifth aspect of the present invention.

In the fabrication method according to the sixth aspect of the present invention, wet etching is first performed in advance of the dry etching step, whereby an upper edge of the second opening is smoothed. Therefore, "step coverage" of the main electrode is improved in the second opening.

Preferably, the semiconductor substrate consists of a semiconductor which is prepared from a base material of silicon, each of the insulating film and the protective film substantially consists of a silicon oxide, the gate electrode substantially consists of polycrystalline silicon, and the wet etching is additionally carried out in advance of the dry etching which is carried out through an etchant consisting of a hydrofluoric acid substance.

Preferably, the wet etching which is additionally carried out in advance of the dry etching is stopped when the depth of the etching reaches a level in the range of about 0.01 μm to about 0.02 μm.

Accordingly, an object of the present invention is to provide a method of fabricating an insulated gate semiconductor device which can prevent a gate electrode from being etched down while guaranteeing insulation between the gate electrode and a source electrode, thereby suppressing the percent defective of products as well as reduction of the switching speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

First, a first embodiment of the present invention is described.

<1-1. Structure and Operation of Device>

Figure 2:
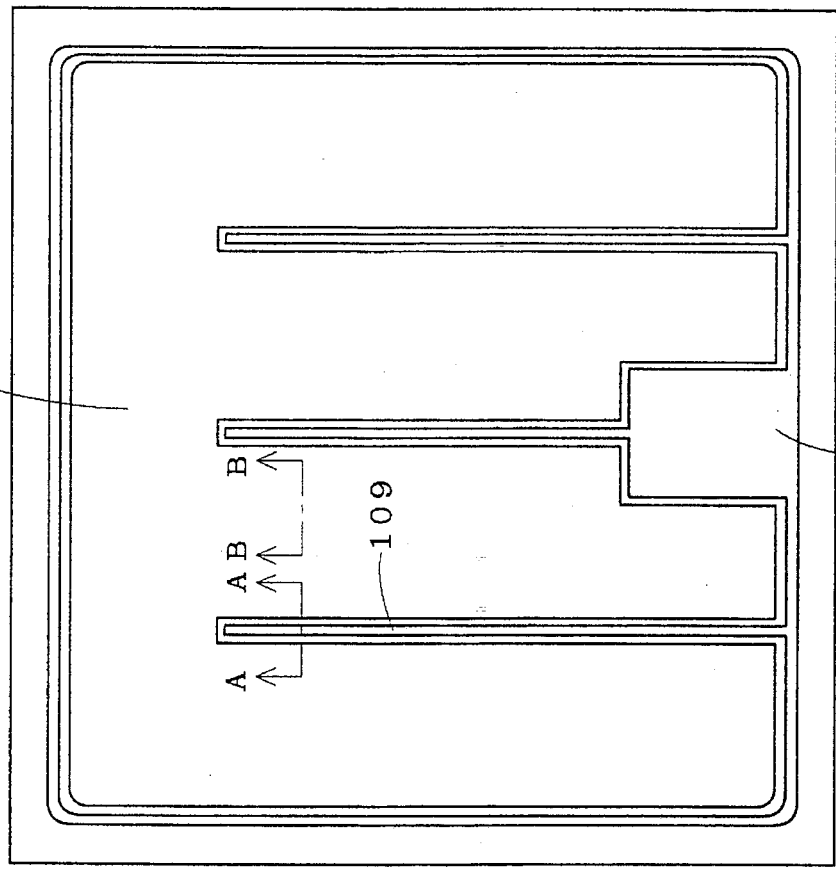
FIG. 2 is a plan view showing the MOSFET according to the first embodiment of the present invention.

FIG. 2 is a plan view showing a MOSFET 100 according to this embodiment. The MOSFET 100 having a rectangular shape is provided on its upper surface with a rectangular gate pad GP which is adjacent to the center of its one side, while an integrally formed gate wire 109 is connected to the gate pad GP. The gate wire 109 is arranged along the outer periphery of the MOSFET 100, to project from the side toward an opposite side in the form of a comb.

A source electrode 108 is formed over the entire surface of a region which is enclosed with the gate wire 109. A number of unit cells (not shown) are arranged in the form of a matrix on a lower portion (the other side in FIG. 2) of the source electrode 108. Each unit cell has a single MOSFET element. Namely, the MOSFET 100 is formed by a number of MOSFET elements which are connected in parallel with each other. The region where the unit cells are arranged is called a "cell region". On the other hand, a region corresponding to that immediately under the gate wire 109 is called a "gate wire region". The gate wire 109, the gate pad GP and the source electrode 108 are made of Al-Si, for example.

Figure 1A:
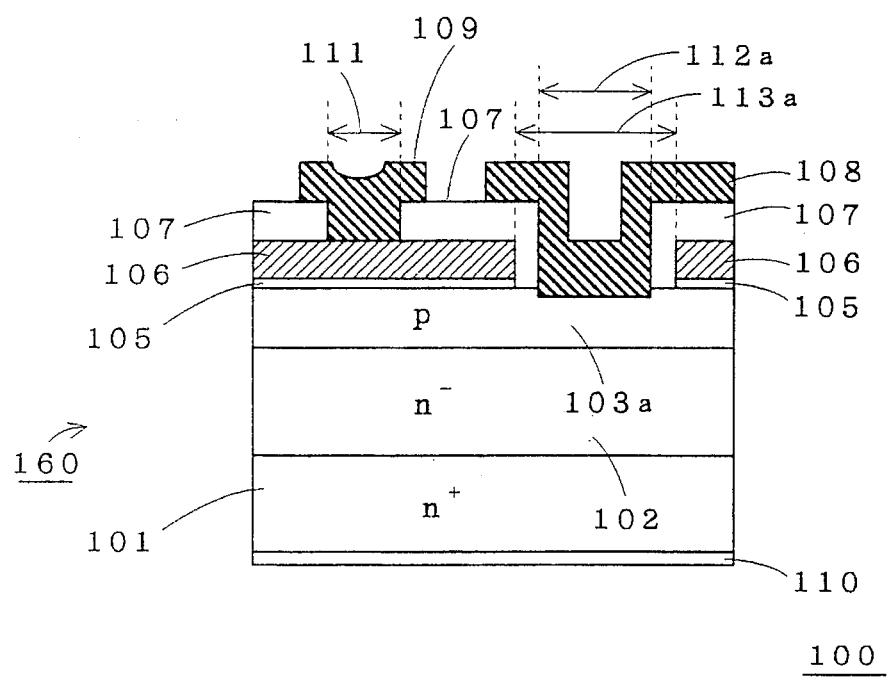
FIGS. 1A and 1B are front sectional views showing a MOSFET according to a first embodiment of the present invention.
Figure 1B:
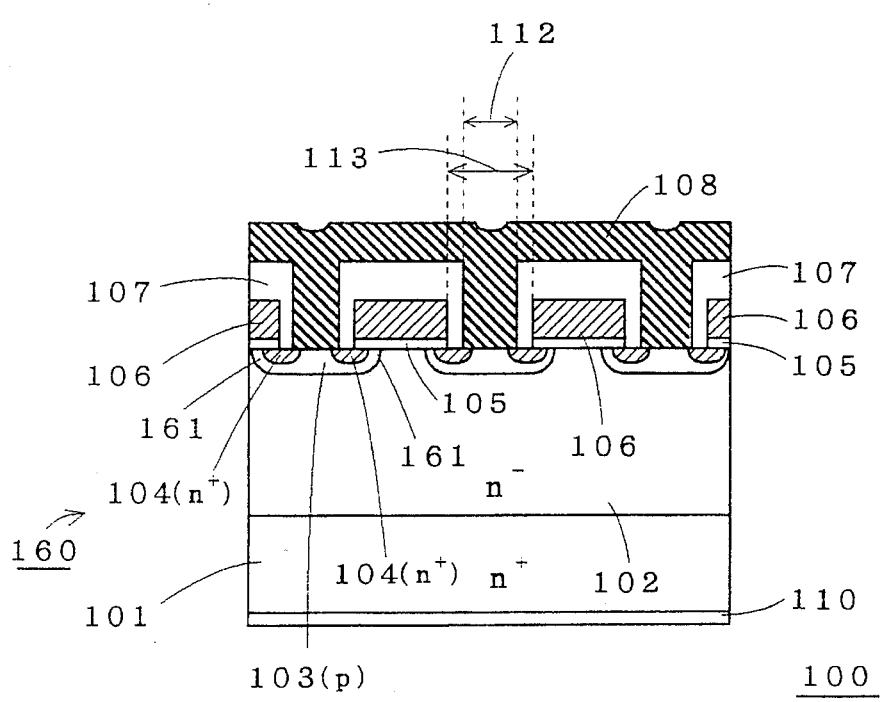
Figure 3A:
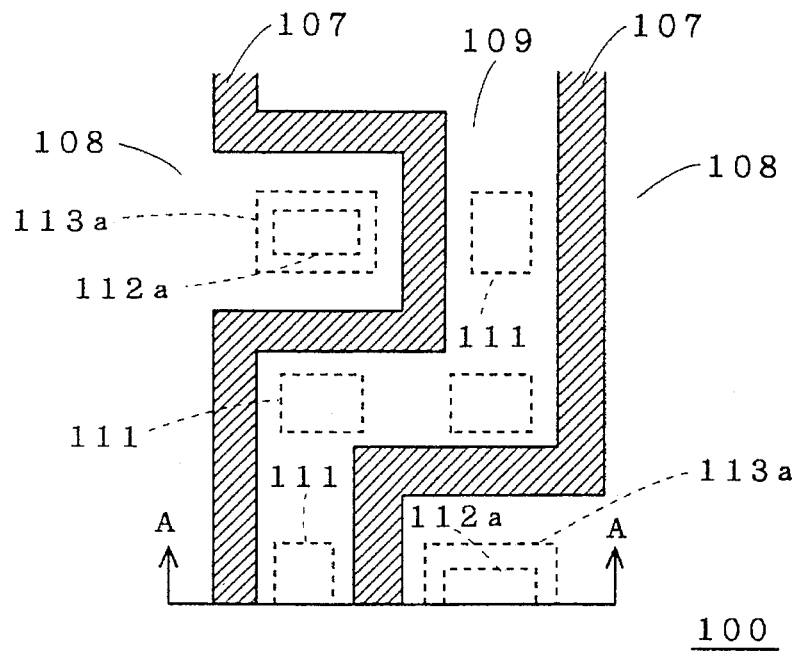
FIGS. 3A and 3B are enlarged partial plan views showing the MOSFET according to the first embodiment of the present invention.
Figure 3B:
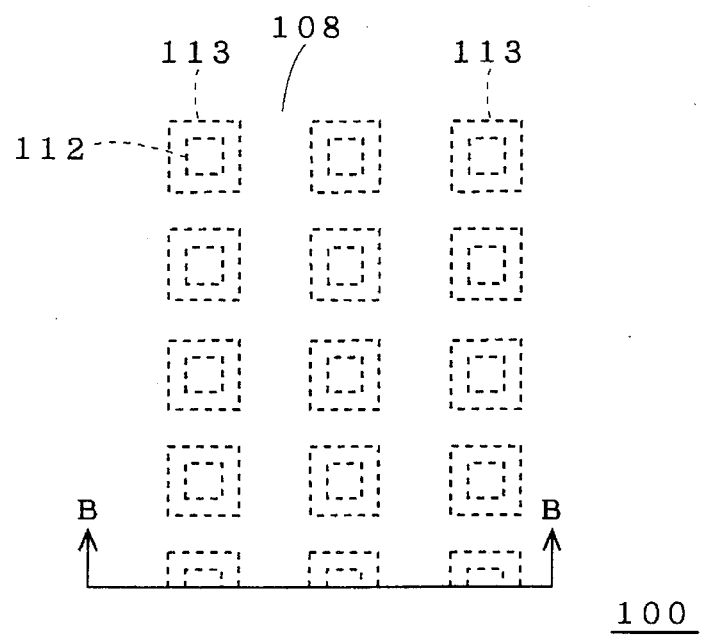

FIGS. 3A and 3B are enlarged partial plan views of the MOSFET 100, and FIGS. 1A and 1B are partial sectional views thereof. FIGS. 1A and 3A correspond to the gate wire region, while FIGS. 1B and 3B correspond to the cell region. FIGS. 1A and 1B are sectional views taken along the lines A—A and B—B in FIGS. 3A and 3B respectively.

In the MOSFET 100, the gate wire 109 is arranged not in the form of a straight line but in a meandering manner, while the source electrode 108 is also connected to a p well 103a which is formed in the gate wire region.

In the MOSFET 100, further, an n$^-$-type semiconductor layer 102 containing an n-type impurity of low concentration is formed on a semiconductor substrate forming an n$^+$-type semiconductor layer 101 containing an n-type impurity of high concentration, while a p-type impurity is selectively diffused into an upper major surface portion of the n$^-$-type semiconductor layer 102 thereby selectively forming p base layers 103 and the p well 103a. The p base layers 103 are formed for the respective unit cells, while the p well 103a is formed in the gate wire region.

Further, an n-type impurity of high concentration is selectively diffused into upper major surfaces of the p base layers 103, thereby selectively forming n$^+$ emitter layers 104. A flat plate type semiconductor substrate 160 is formed by these five types of semiconductor layers. The semiconductor substrate 160 which is made of a base material of silicon is provided on its upper major surface with a gate electrode 106 which is made of polysilicon through a gate insulating film 105.

The gate electrode 106 is provided with openings (gate openings) 113 for the respective unit cells, so that opening edges thereof are positioned immediately on or somewhat inside outer edges of the n$^+$ emitter layers 104. Namely, the gate electrode 106 is so arranged as to cover upper surface portions of the p base layers 103, i.e., channel regions 161, which are held between the n$^+$ emitter layers 104 and the n$^-$-type semiconductor layer 102 in the respective unit cells. The gate electrode 106 is further provided with another type of openings (gate openings) 113a in the gate wire region. The gate openings 113a are provided in the region of the p well 103a.

The gate electrode 106 is covered with a protective film 107 which is formed by a silicon oxide film. This protective film 107 is provided with openings 112 inside the gate openings 113. The source electrode 108 is connected to the upper surfaces of the n$^+$ emitter layers 104 and those of the p base layers 103 held by the n$^+$ emitter layers 104 every unit.

The protective film 107 is further provided with openings 112a inside the gate openings 113a. The source electrode 108 is connected to the upper surface of the p well 103a through the openings 112a. The source electrode 108 is electrically insulated from the gate electrode 106 by the protective film 107.

The protective film 107 is further provided with openings 111 in positions corresponding to those immediately above the p well 103a. The aforementioned gate wire 109 is connected to the gate electrode 106 through the openings 111. The gate wire 109 is electrically insulated from the source electrode 108. Both of the source electrode 108 and the gate wire 109 are made of conductive Al-Si. A drain electrode 110 which is made of conductive Ti/Ni/Au is formed on a lower major surface of the semiconductor substrate 160, i.e., that of the n$^+$-type semiconductor layer 101.

In order to use this MOSFET 100, an external power source and an external load are first connected to positively apply a drain voltage $V_{DS}$ across the drain electrode 110 and the source electrode 108. In this case, a gate voltage $V_{GS}$ exceeding a prescribed gate threshold voltage $V_{GS(th)}$ is positively applied across the gate electrode 106 and the source electrode 108 through the gate pad GP, whereby the p-type channel regions 161 partially forming the p-type p base layers 103 are reversed to an n type, so that n-type channels are defined in the channel regions 161. The n$^+$ emitter layers 104 and the n$^-$-type semiconductor layer 2 conduct by these channels. Consequently, a main current flows from the drain electrode 110 to the source electrode 108. Namely, the MOSFET 100 conducts.

Then, the gate voltage $V_{GS}$ is returned to zero or a minus (reverse-bias) value, whereby the channels defined in the channel regions 161 disappear so that the channel regions 161 return to the original p conductivity type. Consequently, the n⁺ emitter layers 104 are disconnected from the n⁻-type semiconductor layer 102, whereby no main current flows. Namely, the MOSFET 100 enters a nonconducting state. Thus, conduction and disconnection of the main current, i.e., a switching operation, is implemented by adjustment of the value of the gate voltage $V_{GS}$ in the MOSFET 100.

In this MOSFET 100, the source electrode 108 is connected to the p well 103a through the openings 112a for improving the so-called "drawing effect" for the main current, thereby attaining an effect of improving the switching rate. Since the gate wire 109 is arranged in a meandering manner, it is possible to set the p well 103a in a narrow width while arranging contact portions between the source electrode 108 and the p well 103a on both sides of the gate wire 109.

<1-2. Fabrication Steps for Device>

FIGS. 4 to 22B are step diagrams showing steps of fabricating the MOSFET 100. The steps of fabricating the MOSFET 100 are now described with reference to these step diagrams. Among these step diagrams, FIGS. 5A to 22A show sections taken along the line A—A similarly to FIG. 1A, while FIGS. 5B to 22B show sections taken along the line B—B in the cell region, similarly to FIG. 1B.

Figure 4:
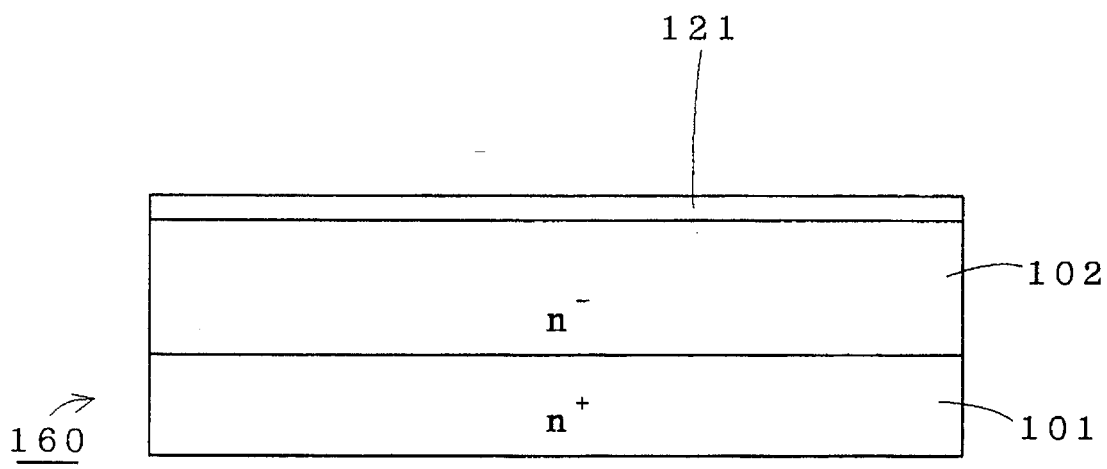
FIG. 4 is a fabrication step diagram of the MOSFET according to the first embodiment of the present invention.

In order to fabricate the MOSFET 100, a silicon substrate containing an n-type impurity in high concentration is first prepared as shown in FIG. 4. This silicon substrate corresponds to the aforementioned n⁺-type semiconductor layer 101. The n⁻-type semiconductor layer 102 containing an n-type impurity in low concentration is formed on the upper major surface of the n⁺-type semiconductor layer 101 by epitaxial growth. Consequently, the flat plate type semiconductor substrate 160 is formed with a base material of silicon. After such formation of the semiconductor substrate 160, a silicon oxide film, i.e., an SiO₂ film 121 is formed over the entire upper major surface of the semiconductor substrate 160.

Figure 5A:
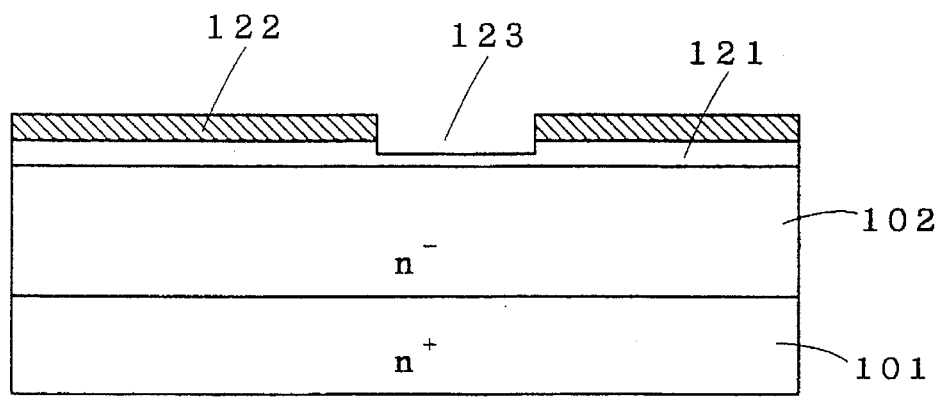
FIGS. 5A and 5B are fabrication step diagrams of the MOSFET according to the first embodiment of the present invention.
Figure 5B:
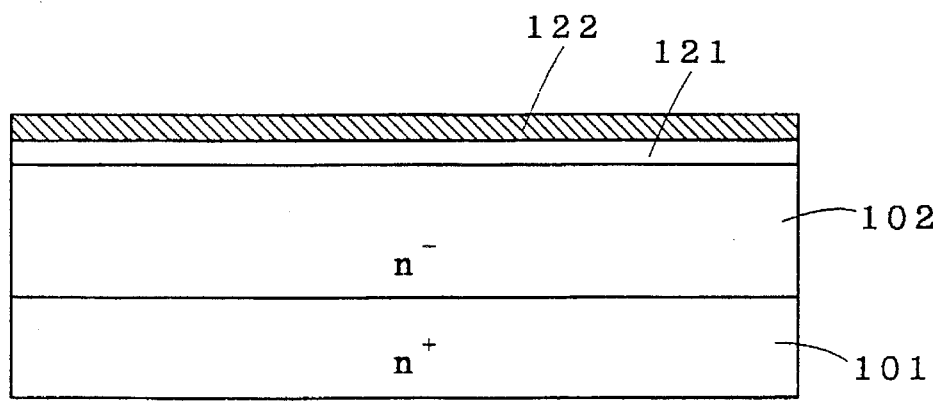

Then, a resist film 122 is applied onto the overall upper surface of the SiO₂ film 121 and thereafter a strip-shaped opening 123 is selectively formed in the gate wire region by photolithography, as shown in FIGS. 5A and 5B. The resist film 122 is employed as a screen for selectively etching the SiO₂ film 121, thereby selectively forming the strip-shaped opening 123 in the SiO₂ film 121 in the gate wire region.

Figure 6A:
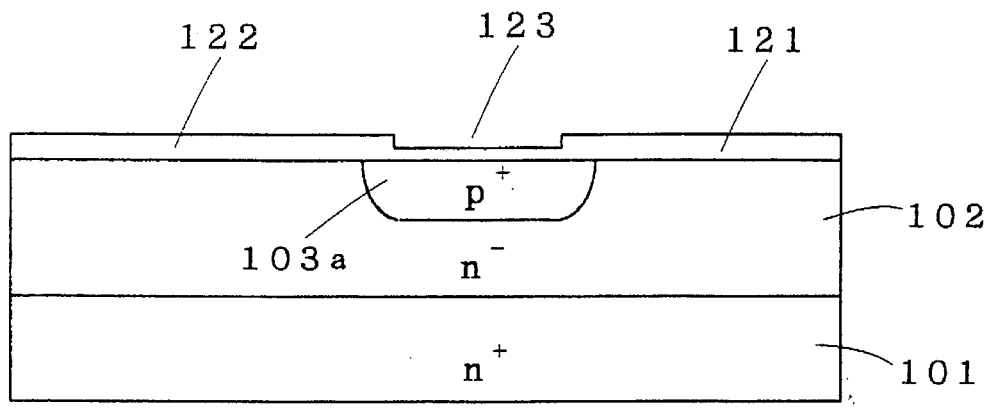
FIGS. 6A and 6B are fabrication step diagrams of the MOSFET according to the first embodiment of the present invention.
Figure 6B:
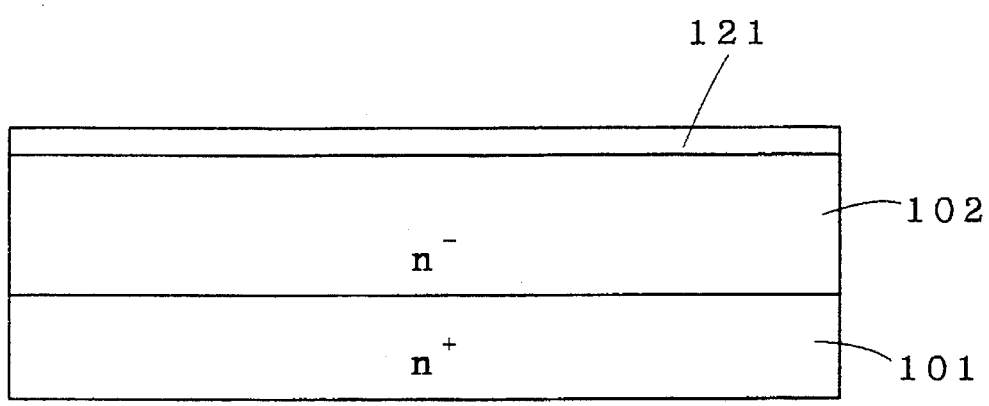

Thereafter the resist film 122 is removed, as shown in FIGS. 6A and 6B. The SiO₂ film 121 having the opening 123 is employed as a screen, for selectively injecting boron, which is a p-type impurity, into the upper major surface of the n⁻-type semiconductor layer 102. Thereafter annealing is carried out to diffuse the injected p-type impurity, thereby selectively forming the strip-shaped p well 103a in the upper major surface of the n⁻-type semiconductor layer 102 in the gate wire region. The width of the p well 103a is about 70 μm, for example.

Figure 7A:
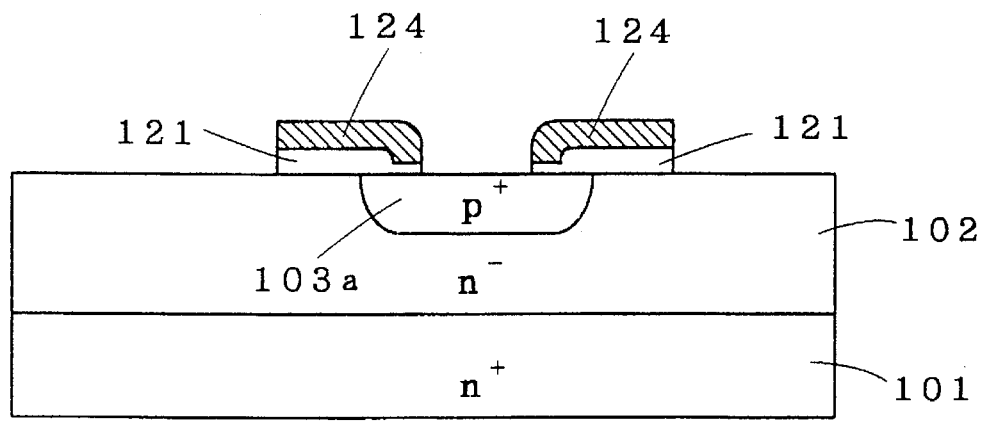
FIGS. 7A and 7B are fabrication step diagrams of the MOSFET according to the first embodiment of the present invention.
Figure 7B:
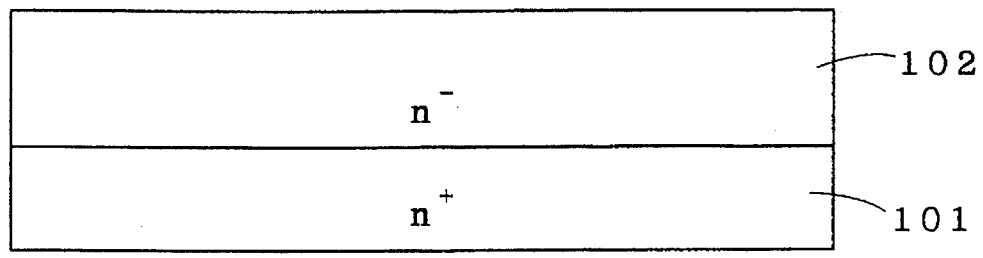

Then, resist films 124 are selectively formed in the vicinity of the opening 123 by photolithography, as shown in FIGS. 7A and 7B. Thereafter the resist films 124 are employed as screens to carry out etching, thereby selectively removing the SiO₂ film 121. Consequently, the SiO₂ film 121 remains only on regions covered with the resist films 124, and removed in all of the remaining regions. Namely, parts of the SiO₂ film 121 remain to cover junctions between the p well 103a and the n⁻-type semiconductor layer 102.

Figure 8A:
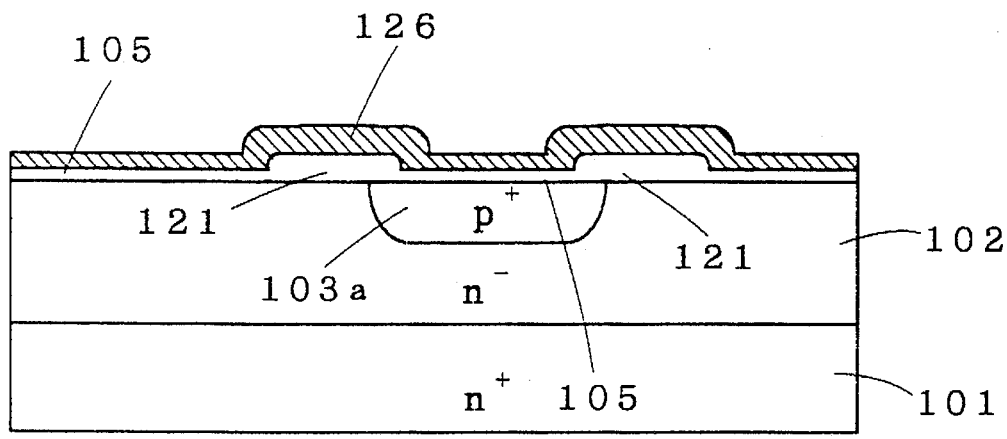
FIGS. 8A and 8B are fabrication step diagrams of the MOSFET according to the first embodiment of the present invention.
Figure 8B:
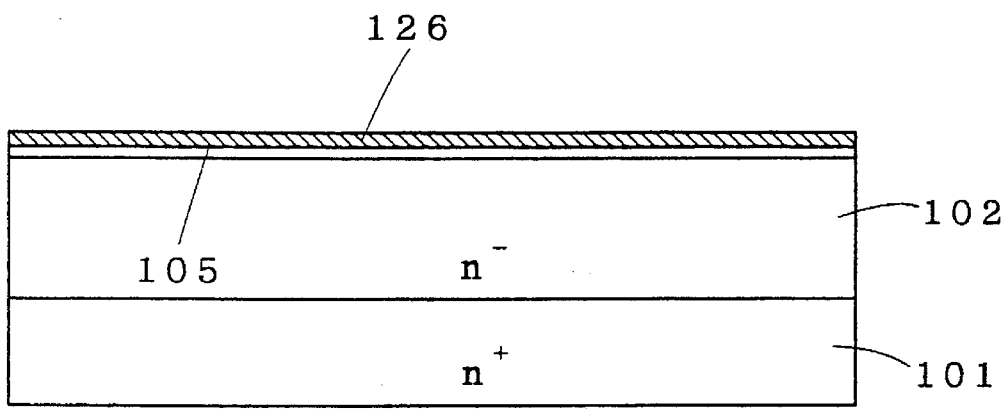

Then, the resist films 124 are first removed, and thereafter a gate insulating film 105 which is a new SiO₂ film is formed to cover the exposed portion of the upper major surface of the n⁻-type semiconductor layer 102, as shown in FIGS. 8A and 8B. This gate insulating film 105 is set to be smaller in thickness than the SiO₂ films 121. Thereafter a polysilicon layer 126 is deposited to cover the overall upper surfaces of the SiO₂ films 121 and 125. The gate insulating film 105 is adapted to separate the polysilicon layer 126 for defining the gate electrode 106 in a later step from the semiconductor substrate 160. The polysilicon layer 126 is deposited in a thickness of about 0.5 μm, for example.

Figure 9A:
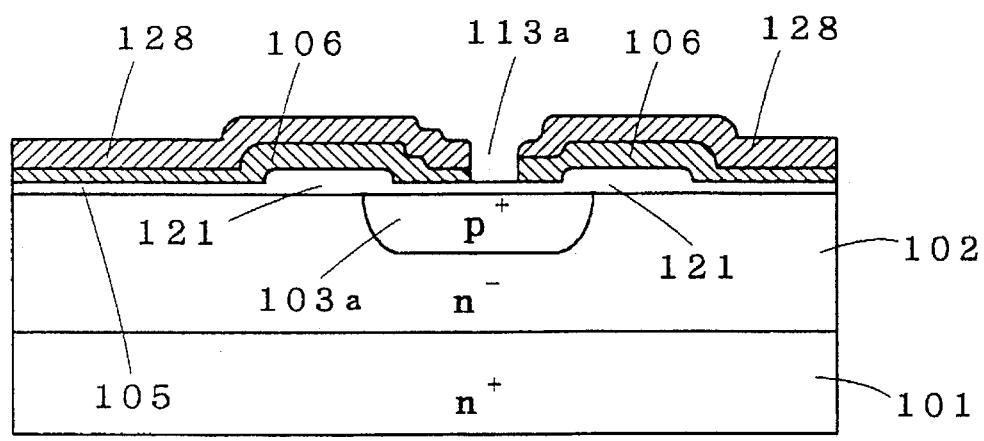
FIGS. 9A and 9B fabrication step diagrams of the MOSFET according to the first embodiment of the present invention.
Figure 9B:
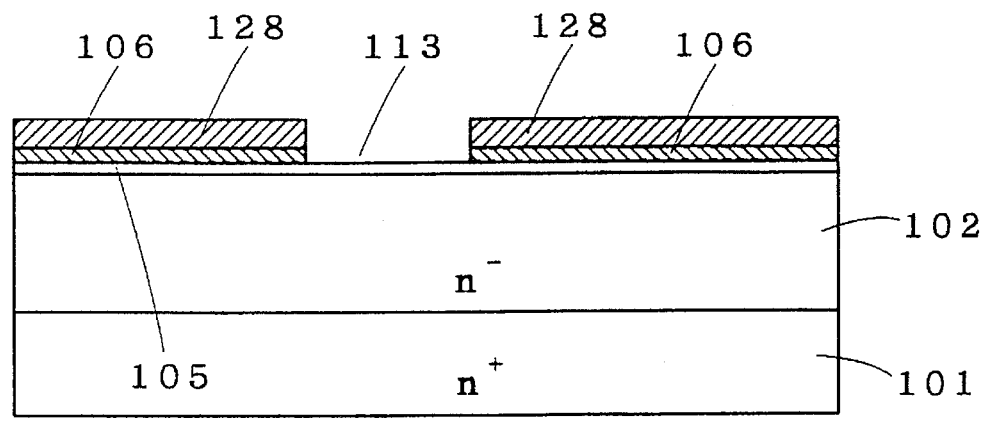

Then, a resist film 128 having an opening above the p well 103a of the gate wire region and the gate insulating film 105 of the cell region is selectively formed on the upper surface of the polysilicon layer 126 by photolithography, as shown in FIGS. 9A and 9B. This resist film 128 is employed as a screen, to selectively remove the gate electrode 106. Consequently, the gate electrode 106 is provided with the gate openings 113a and 113 on the p well 103a and a portion of the n⁻-type semiconductor layer 102 in the cell region respectively.

Figure 10A:
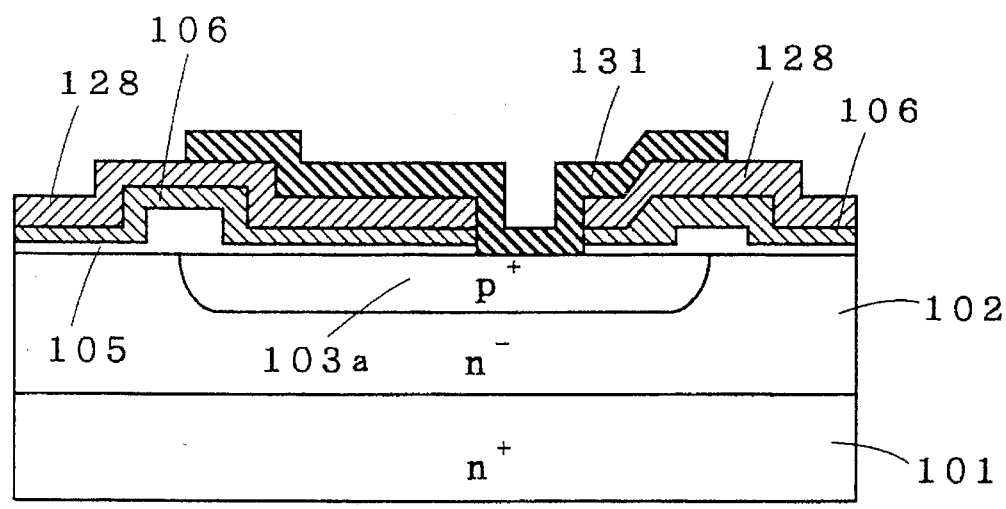
FIGS. 10A and 10B are fabrication step diagrams of the MOSFET according to the first embodiment of the present invention.
Figure 10B:
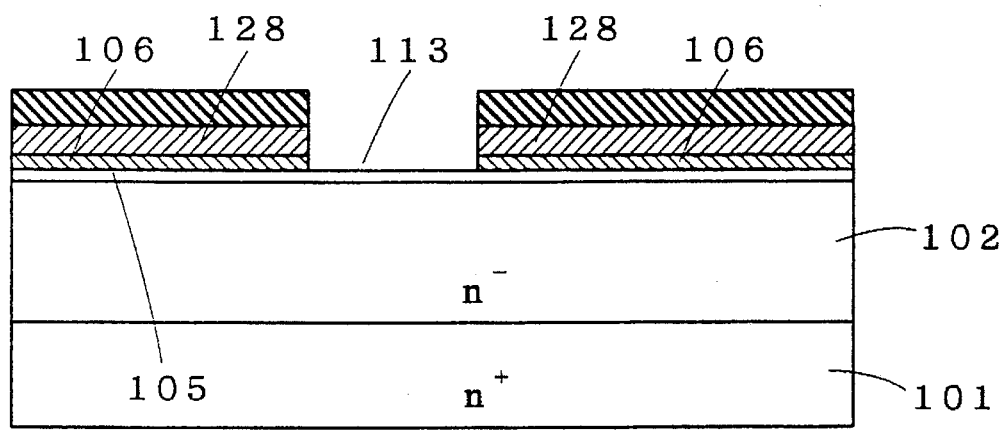

Then, a new resist film 131 is formed to cover the gate openings 113a, as shown in FIGS. 10A and 10B. Thereafter the gate electrode 106 and the resist films 128 and 131 are employed as screens, for introducing boron, which is a p-type impurity, into the upper major surface of the n⁻-type semiconductor layer 102. Consequently, the boron is selectively introduced into the upper major surface of the n⁻-type semiconductor layer 102 in the cell region through the gate openings 113.

Figure 11A:
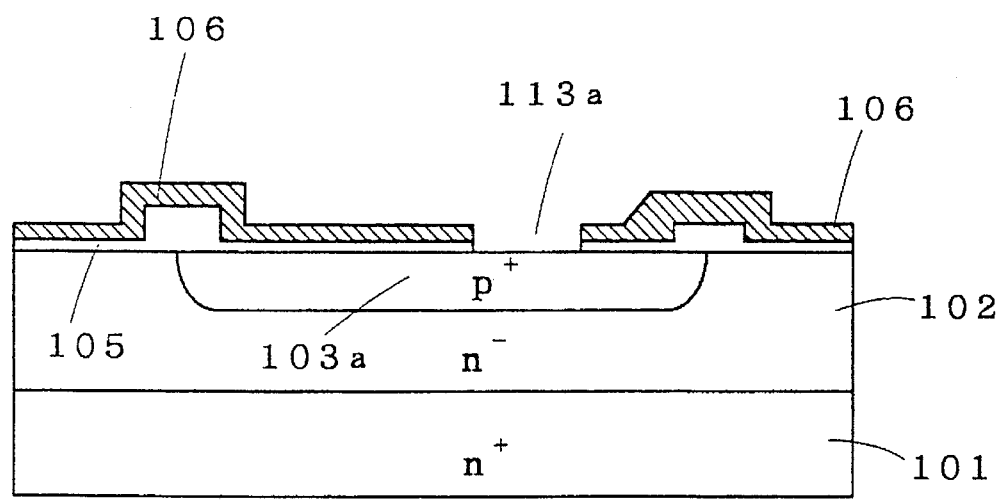
FIGS. 11A and 11B are fabrication step diagrams of the MOSFET according to the first embodiment of the present invention.
Figure 11B:
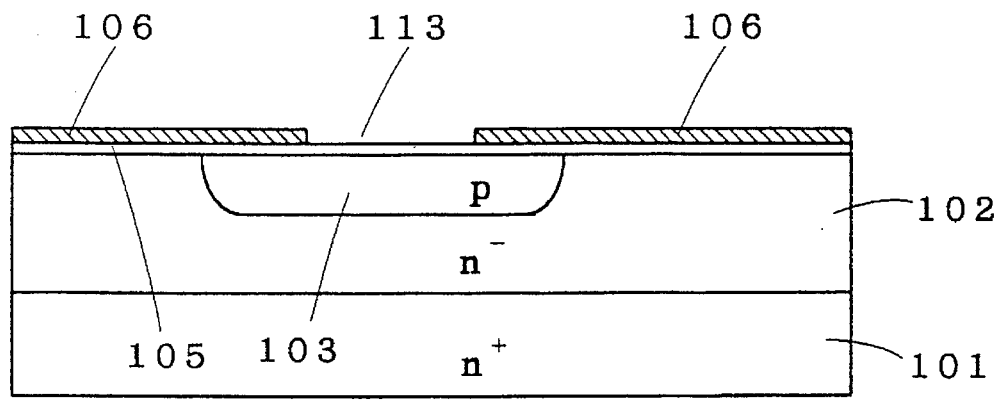

Then, the resist films 128 and 131 are removed, and thereafter annealing is performed to diffuse the boron which is introduced into the cell region, as shown in FIGS. 11A and 11B. Consequently, the p base layers 103 are selectively formed in the upper major surface of the n⁻-type semiconductor layer 102 in the cell region.

Figure 12A:
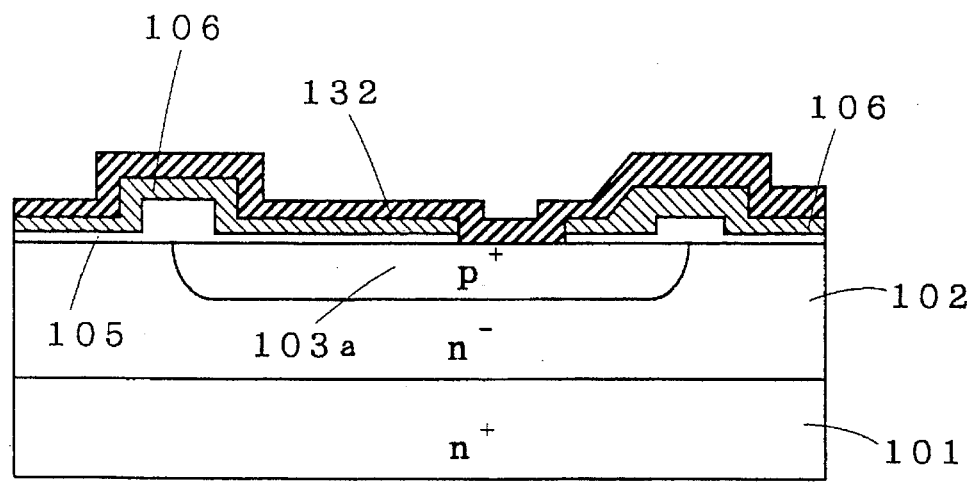
FIGS. 12A and 12B are fabrication step diagrams of the MOSFET according to the first embodiment of the present invention.
Figure 12B:
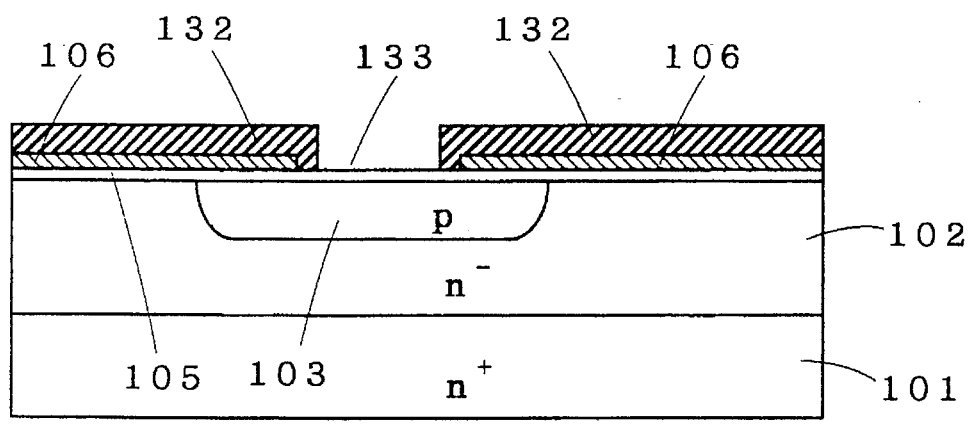

Then, a new resist film 132 is formed to selectively open only inside the gate openings 113, as shown in FIGS. 12A and 12B. Opening ends of gate openings 133 which are defined by the resist film 132 are in positions inwardly retracted from those of the gate openings 113. The other gate openings 113a are covered with the resist film 132. This resist film 132 is employed as a screen, for selectively introducing boron of high concentration into the upper major surfaces of the p base layers 103 from the openings 133.

Figure 13A:
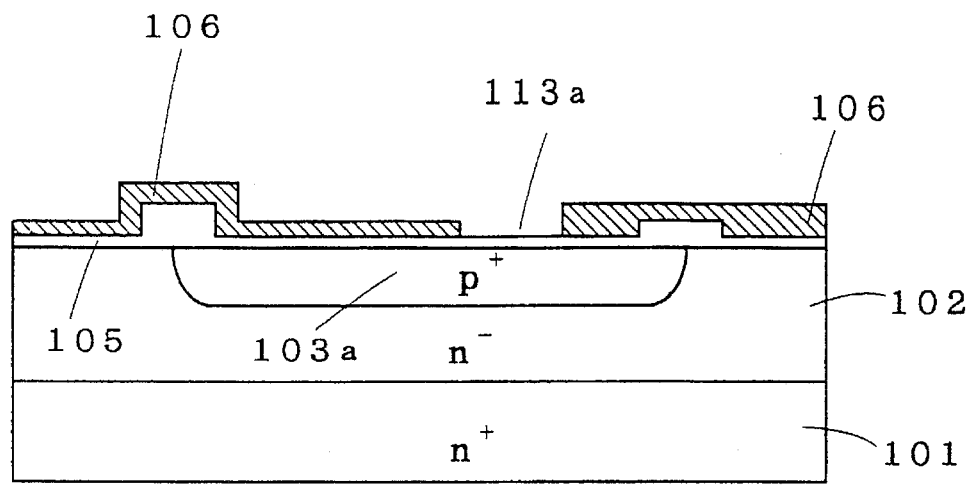
FIGS. 13A and 13B are fabrication step diagrams of the MOSFET according to the first embodiment of the present invention.
Figure 13B:
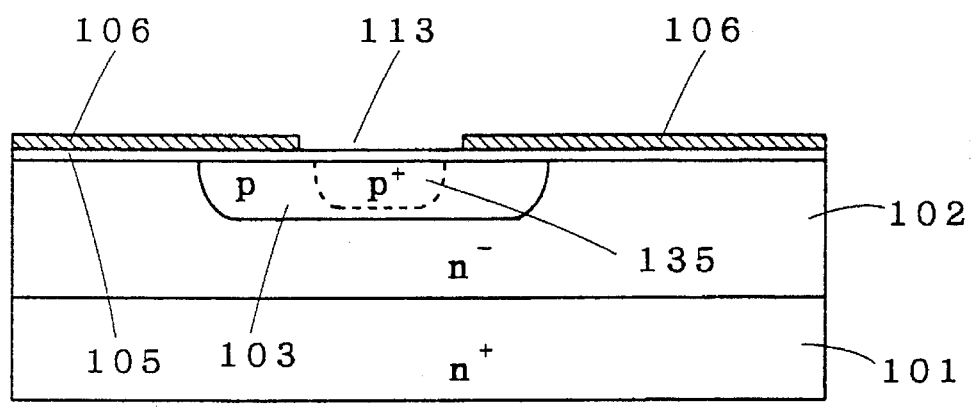

Then, the resist film 132 is removed and thereafter annealing is performed, thereby diffusing the boron which is introduced in high concentration, as shown in FIGS. 13A and 13B. Consequently, p⁺ layers 135 are selectively formed in the upper major surfaces of the p base layers 103.

Figure 14A:
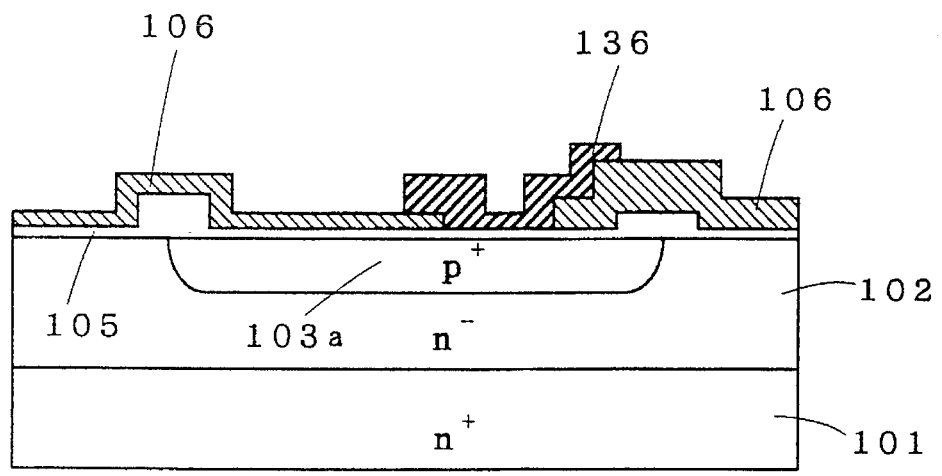
FIGS. 14A and 14B are fabrication step diagrams of the MOSFET according to the first embodiment of the present invention.
Figure 14B:
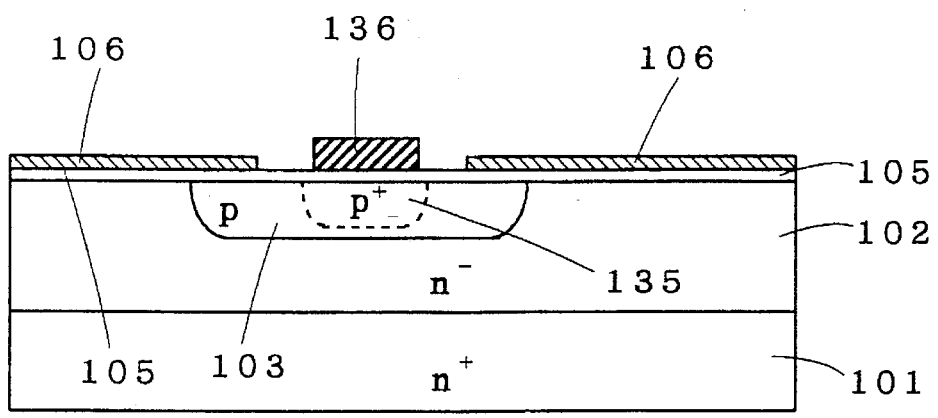

Then, new resist films 136 are selectively formed on central regions of the gate openings 113, as shown in FIGS. 14A and 14B. The resist films 136 are formed somewhat inside the p⁺ layers 135. Further, the resist films 136 are so formed as to also cover the gate openings 113a in the gate wire region. The resist films 136 which are formed in the aforementioned manner and the gate electrode 106 are employed as screens, for selectively removing the gate insulating film 105. Consequently, portions of the gate openings 113 in the gate insulating film 105 which are not covered with the resist films 136 are selectively removed.

Figure 15A:
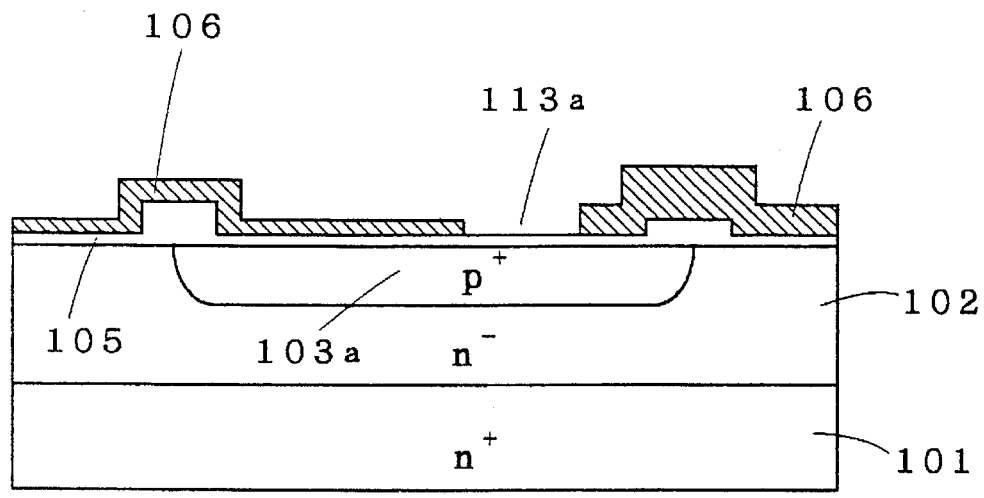
FIGS. 15A and 15B are fabrication step diagrams of the MOSFET according to the first embodiment of the present invention.
Figure 15B:
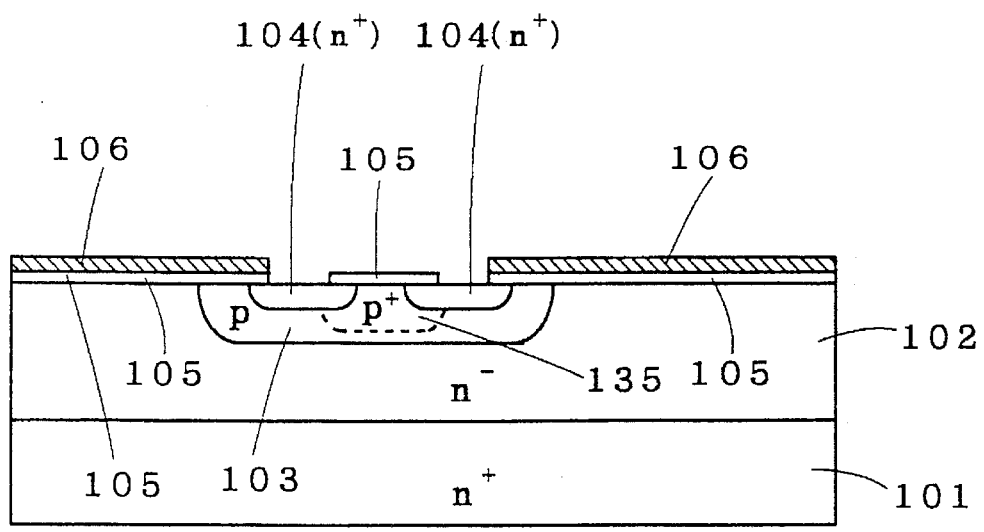

Then, the resist films 136 are first removed, as shown in FIGS. 15A and 15B. The gate insulating film 105 remains in the central portions of the gate openings 113. Thereafter the gate insulating film 105 and the gate electrode 106 are employed as screens, for selectively introducing As (arsenic) which is an n-type impurity into the upper major surfaces of the p base layers 103. Consequently, the $n^+$ emitter layers 104 are formed. Inner edges of the $n^+$ emitter layers 104 are positioned in the $p^+$ layers 135, while outer edges thereof are positioned inside the p base layers 103 and outside the $p^+$ layers 135. The $p^+$ layers 135 are adapted to prevent the MOSFET 100 from breaking caused by conduction of parasitic transistors. In the following figures, the $p^+$ layers 135 are omitted.

Figure 16A:
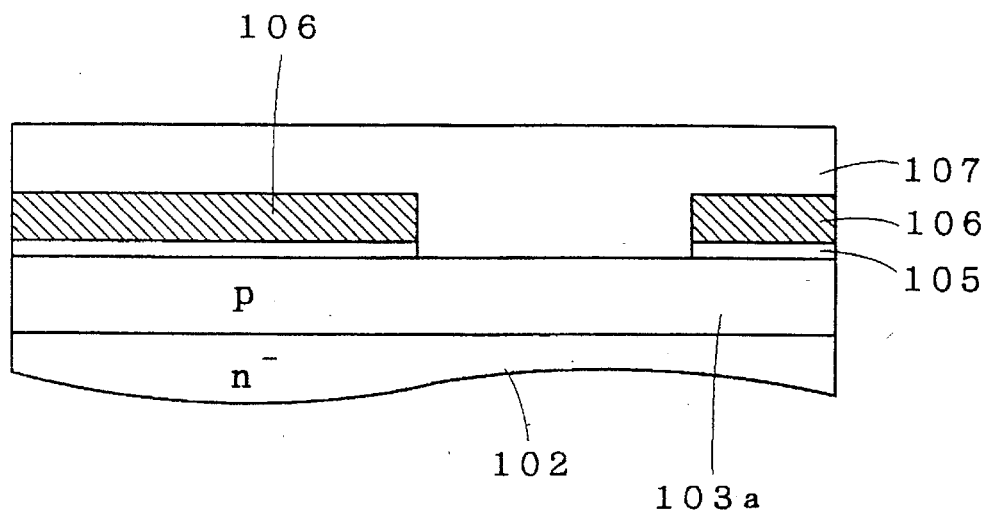
FIGS. 16A and 16B are fabrication step diagrams of the MOSFET according to the first embodiment of the present invention.
Figure 16B:
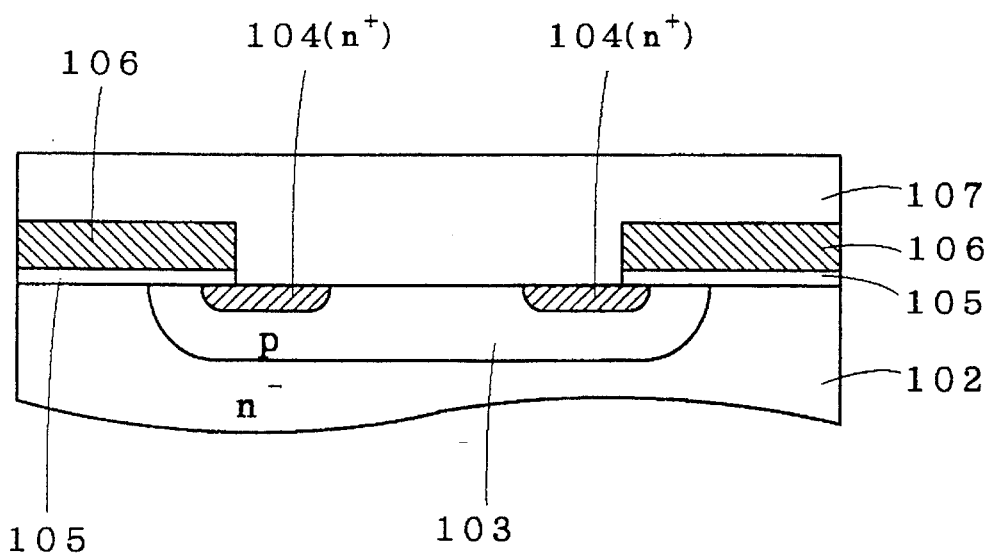

Then, the protective film 107 is formed by depositing $SiO_2$, for example, to cover the upper major surface of the semiconductor substrate 160, the gate insulating film 105, and the overall upper surface of the gate electrode 106, as shown in FIGS. 16A and 16B. At this time, the gate insulating film 105 remaining on the upper surfaces of the p layers 135 in the cell region is integrated with the protective film 107.

Figure 17A:
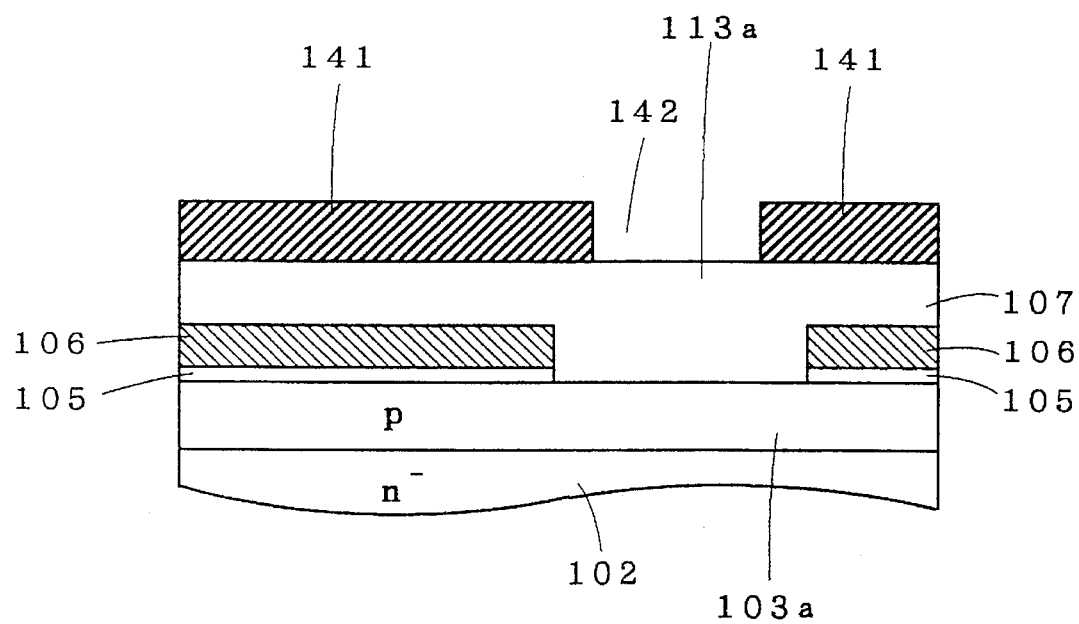
FIGS. 17A and 17B are fabrication step diagrams of the MOSFET according to the first embodiment of the present invention.
Figure 17B:
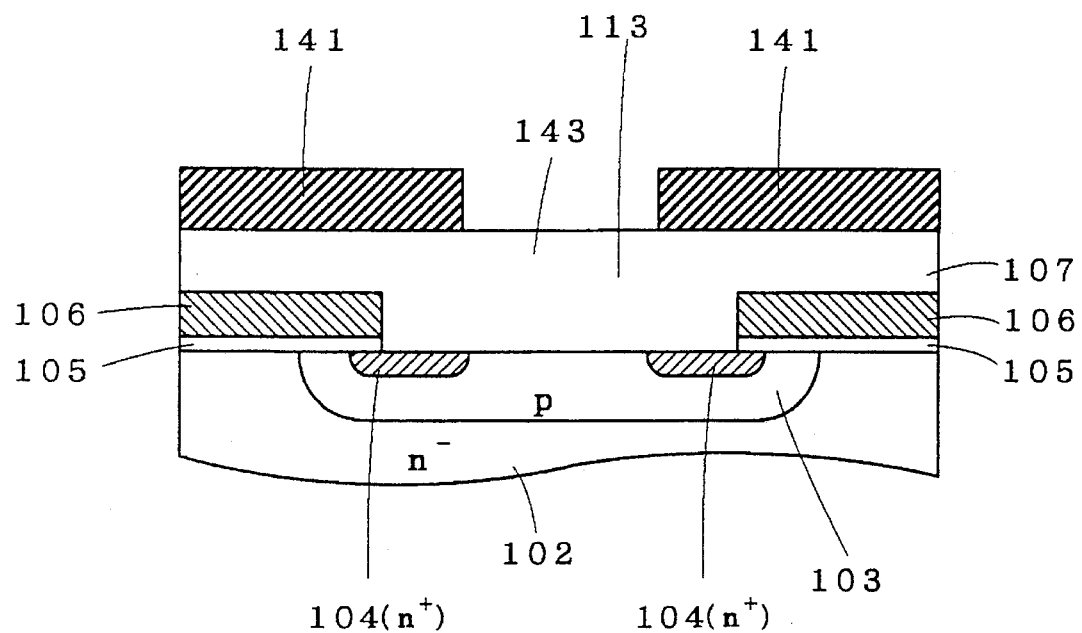

Then, a new resist film 141 is temporarily applied onto the overall upper surface of the protective film 107, as shown in FIGS. 17A and 17B. Thereafter the resist film 141 is provided with openings 142 and 143 in positions above central portions of the gate openings 113a and 113 in the gate wire region and the cell region respectively by photolithography.

Figure 18A:
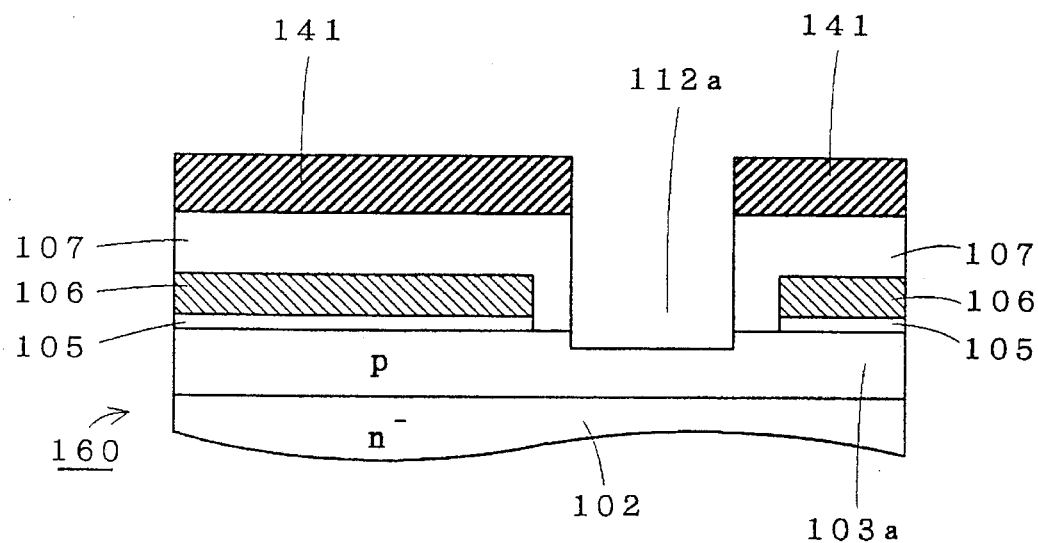
FIGS. 18A and 18B are fabrication step diagrams of the MOSFET according to the first embodiment of the present invention.
Figure 18B:
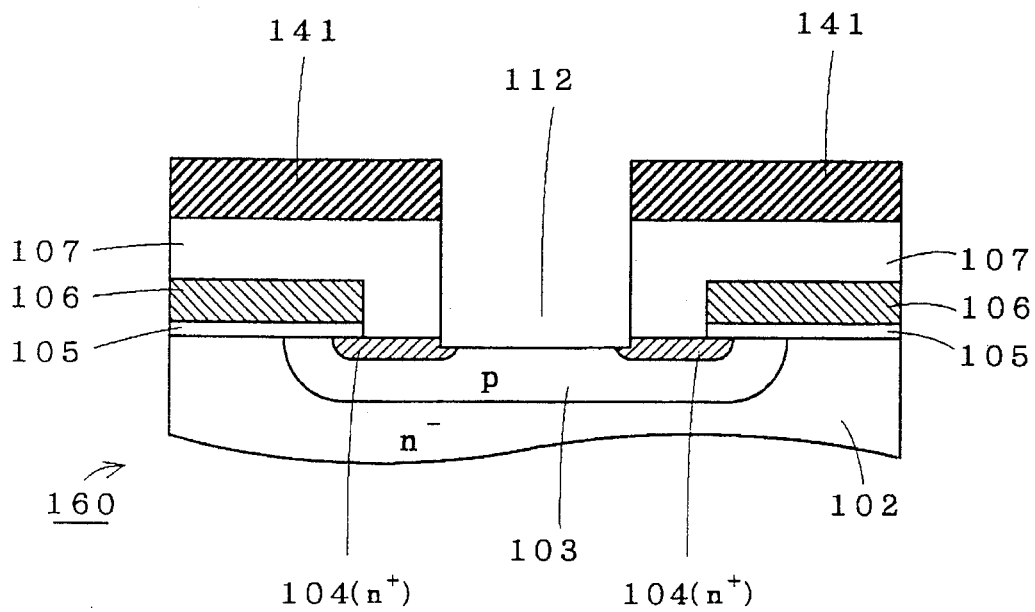

Then, the resist film 141 is employed as a screen to selectively etch the protective film 107, as shown in FIGS. 18A and 18B. This etching is carried out by dry etching such as RIE (reactive ion etching), for example. At this time, the etching is so carried out as to slightly etch down the upper major surface of the semiconductor substrate 160.

Thus, the openings 112a and 112 of the protective film 107 are formed immediately under the openings 142 and 143 of the resist film 141 respectively. Consequently, inner side portions of the $n^+$ emitter layers 104 and the $p^+$ layers 135 held by the $n^+$ emitter layers 104 are exposed in the openings 112. Further, the upper major surface of the p well 103a is exposed in the openings 112a.

Figure 19A:
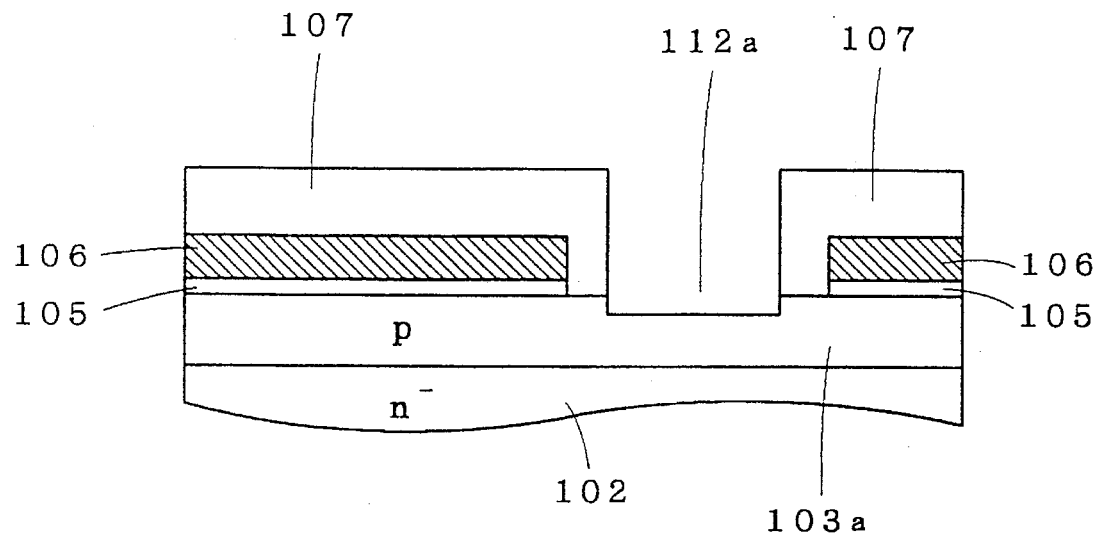
FIGS. 19A and 19B are fabrication step diagrams of the MOSFET according to the first embodiment of the present invention.
Figure 19B:
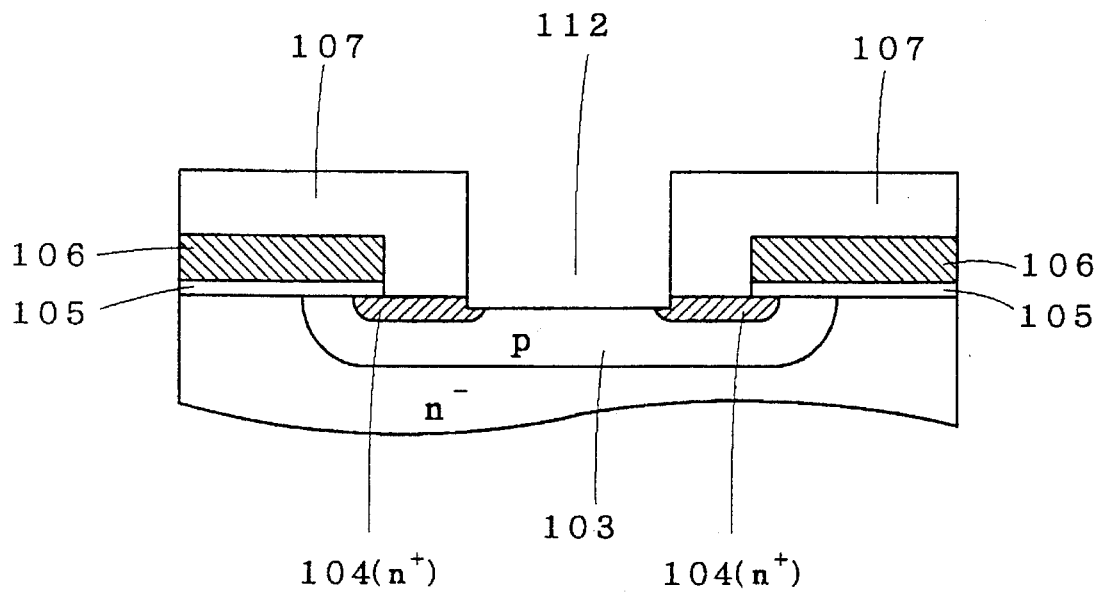

Then, the resist film 141 is removed, as shown in FIGS. 19A and 19B.

Figure 20A:
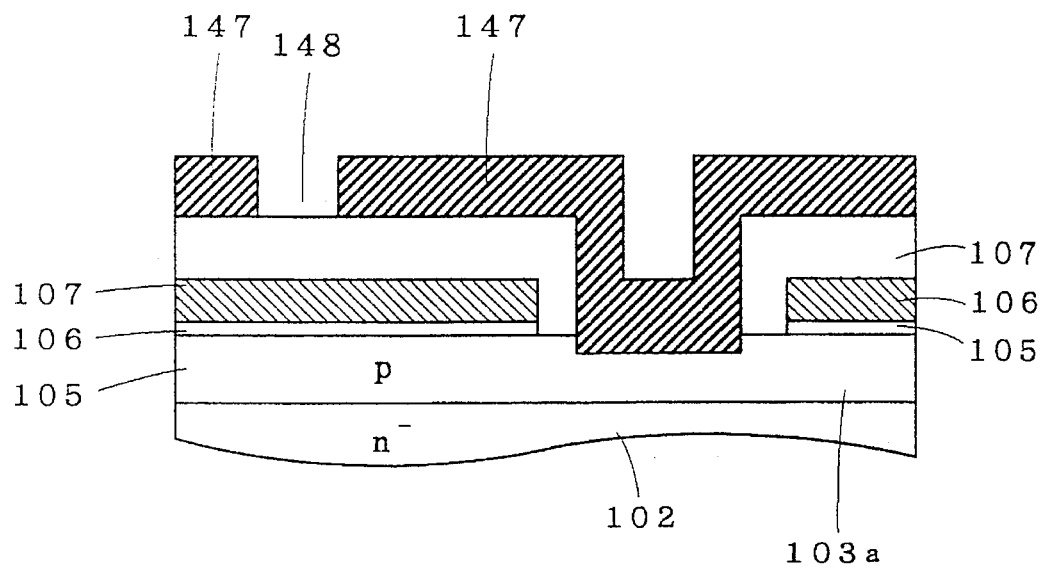
FIGS. 20A and 20B are fabrication step diagrams of the MOSFET according to the first embodiment of the present invention.
Figure 20B:
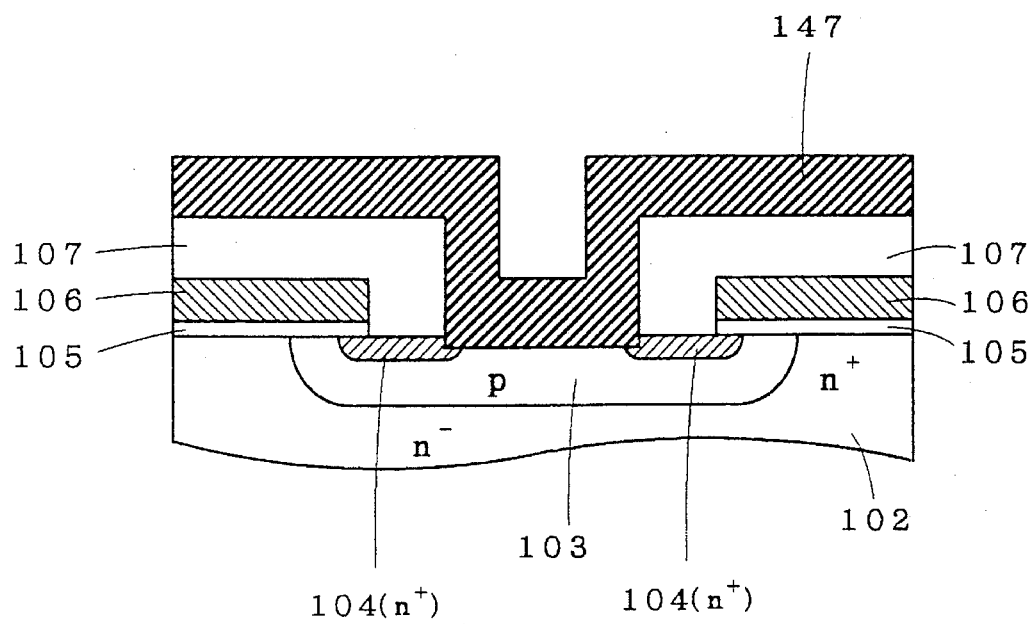

Then, a new resist film 147 is temporarily applied onto the overall upper surface of the protective film 107, as shown in FIGS. 20A and 20B. Thereafter openings 148 are formed in the resist film 147 by photolithography, in portions above the gate electrode 106 in the gate wire region.

Figure 21A:
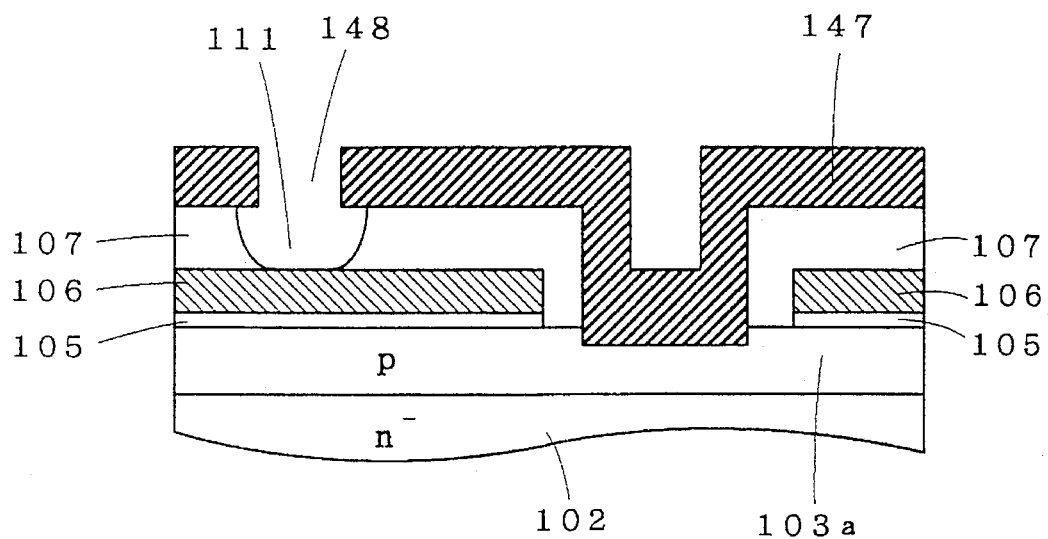
FIGS. 21A and 21B are fabrication step diagrams of the MOSFET according to the first embodiment of the present invention.
Figure 21B:
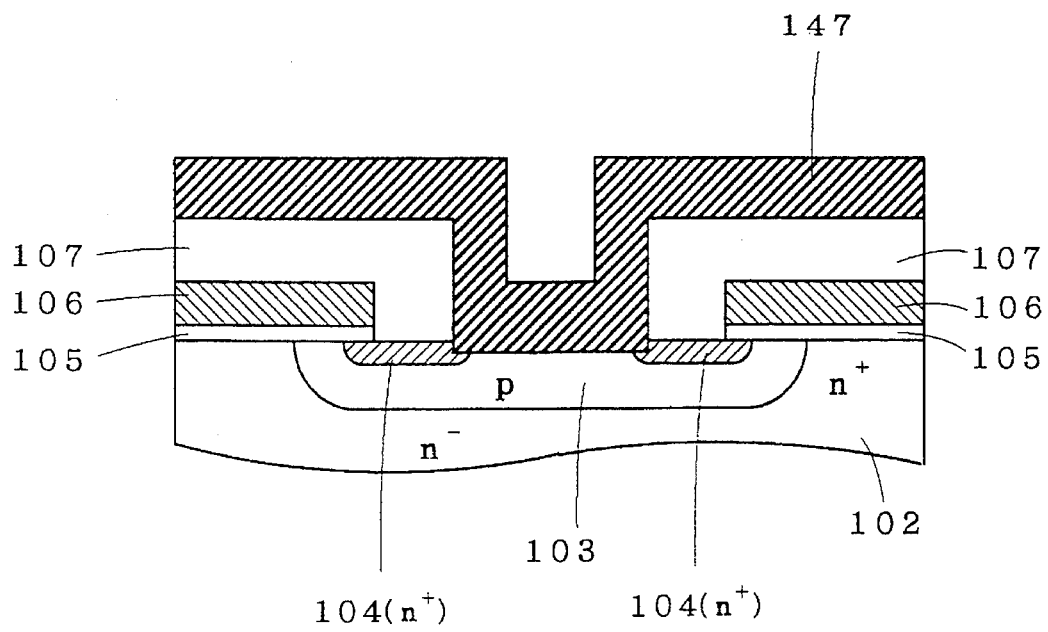

Then, the resist film 147 is employed as a screen to selectively etch the protective film 107, as shown in FIGS. 21A and 21B. This etching is carried out by wet etching. Thus, the openings 111 of the protective film 107 are formed immediately under the openings 148 of the resist film 147. Consequently, the upper surface of the gate electrode 106 is exposed in the openings 111. A hydrofluoric acid etchant is employed for this etching step. Thus, the etchant will not act on the gate electrode 106 which is made of polysilicon, whereby the gate electrode 106 is not unnecessarily etched down.

Figure 22A:
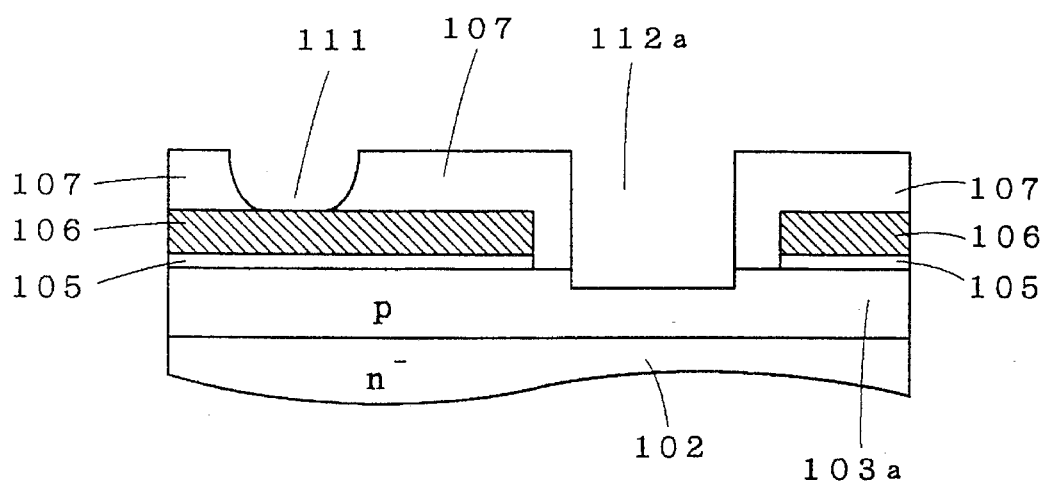
FIGS. 22A and 22B are fabrication step diagrams of the MOSFET according to the first embodiment of the present invention.
Figure 22B:
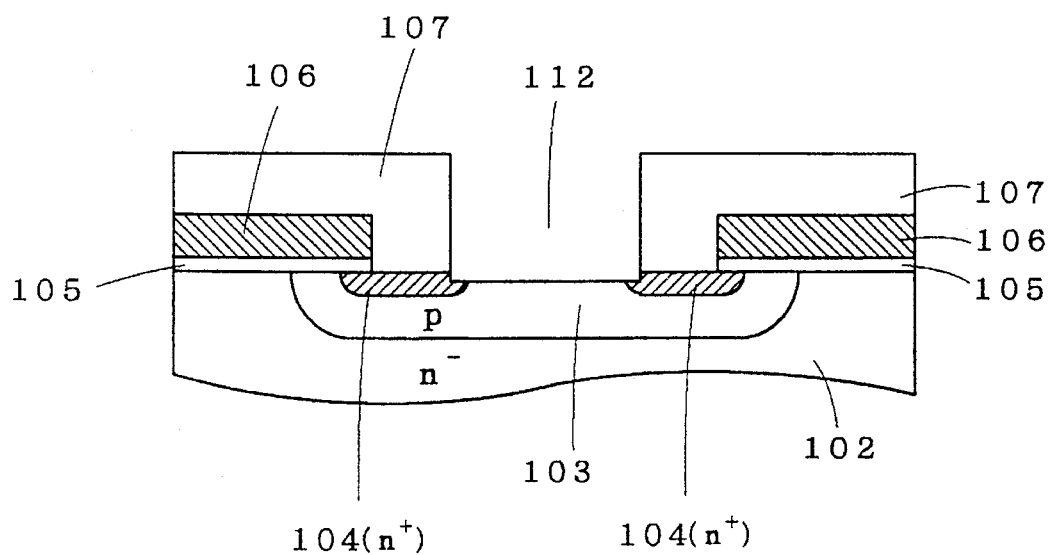

Then, the resist film 147 is removed as shown in FIGS. 22A and 22B.

Referring again to FIG. 1, Al-Si is deposited over the entire upper surfaces of the openings 111, 112a and 112 and the protective film 107 by sputtering or vapor deposition, for example, and selective removal is carried out by photolithography, for forming the source electrode 108 and the gate wire 109. Further, Ti/Ni/Au, for example, is deposited on the overall lower major surface of the semiconductor substrate 160, i.e., the overall lower major surface of the $n^+$-type semiconductor layer 101, to form the drain electrode 110. The MOSFET 100 is completed through the aforementioned steps.

In the fabrication method according to this embodiment, the openings 112 and 112a are formed by dry etching, whereby insulation between the source electrode 108 and the gate electrode 106 is reliably guaranteed similarly to the conventional MOSFET 50, so that it is possible to reduce the percentage of defectiveness resulting from defective insulation in these portions. Further, the upper surface of the semiconductor substrate 160 is etched down in the openings 112, whereby a high switching rate is attained while it is possible to suppress a latch-up phenomenon caused by conduction of parasitic bipolar transistors.

In addition, the openings 111 are formed by wet etching through a properly selected etchant, whereby the gate electrode 106 will not be etched down. Therefore, reduction of the switching rate caused by an etch-down phenomenon of the gate electrode 106 is prevented, while it is possible to prevent defectiveness of the product caused by defective insulation of the gate insulating film 105.

Namely, it is possible to attain an effect of preventing the gate electrode 106 from being etched down while guaranteeing insulation between the gate electrode 106 and the source electrode 108, which cannot be attained in the conventional fabrication method, according to the fabrication method of this embodiment.

<2. Second Embodiment>

A second embodiment of the present invention is now described. In the following figures, portions identical to those of the device according to the first embodiment shown in FIGS. 1 to 22B are denoted by the same reference numerals, to omit redundant description.

<2-1. Structure and Operation of Device>

Figure 23A:
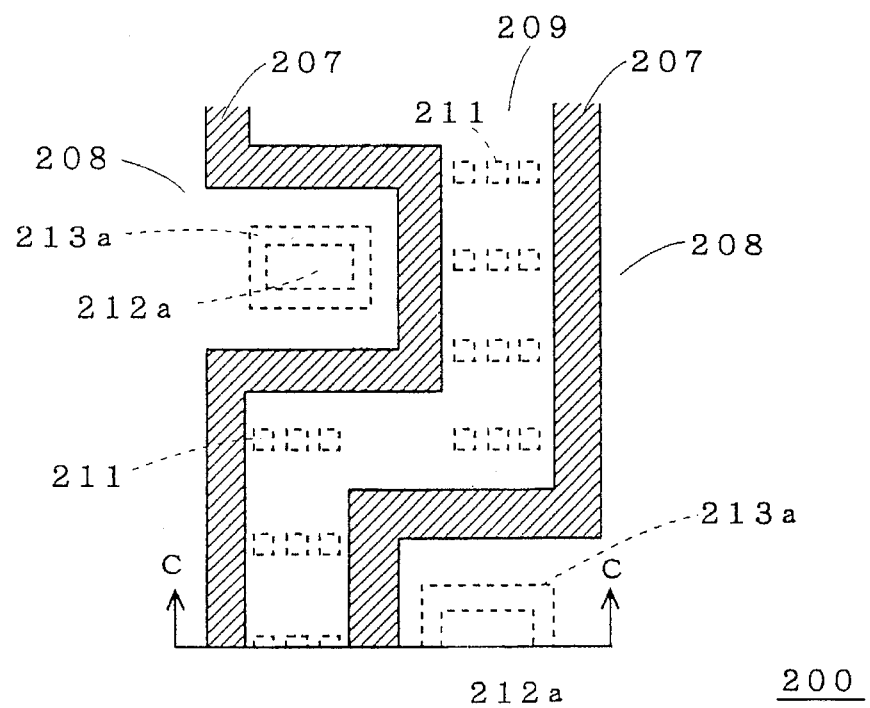
FIGS. 23A and 23B are enlarged partial plan views showing a MOSFET according to a second embodiment of the present invention.
Figure 23B:
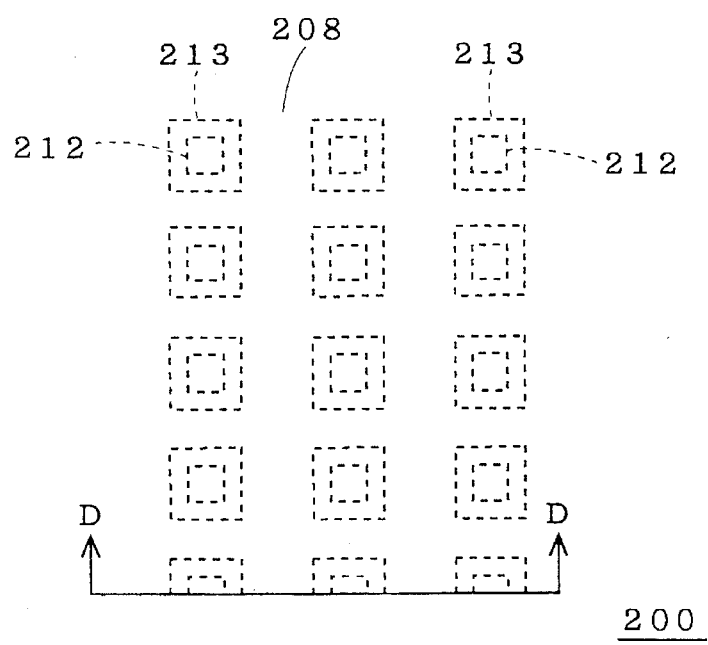
Figure 24A:
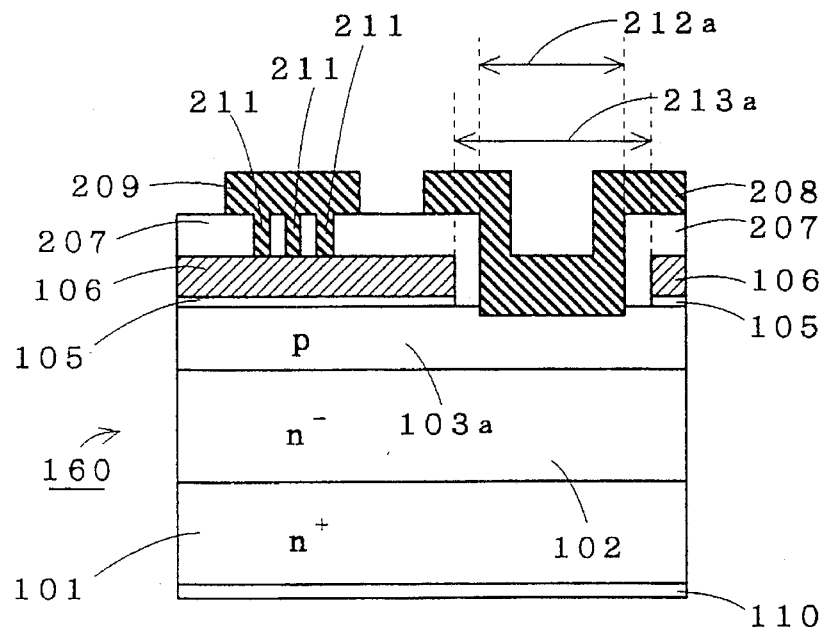
FIGS. 24A and 24B are front sectional views showing the MOSFET according to the second embodiment of the present invention.
Figure 24B:
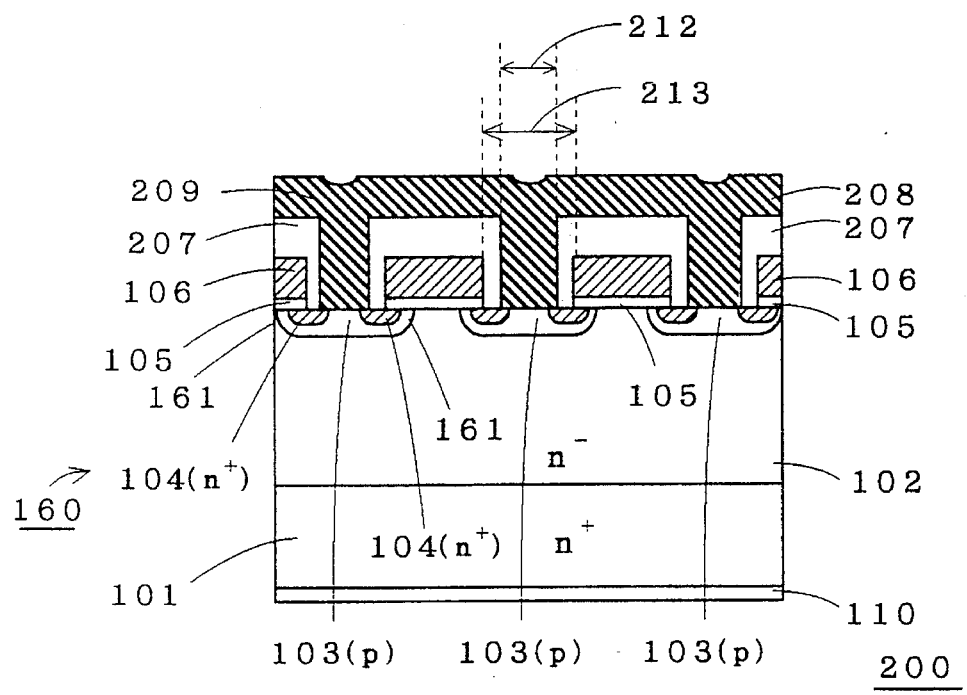

FIGS. 23A and 23B are enlarged partial plan views showing a MOSFET 200 according to this embodiment, and FIGS. 24A and 24B are partial sectional views thereof. FIGS. 23A and 24A correspond to a gate wire region, and FIGS. 23B and 24B correspond to a cell region. Further, FIGS. 24A and 24B are sectional views taken along the lines C—C and D—D in FIGS. 23A and 23B respectively. A general plan view of the MOSFET 200 is expressed similarly to FIG. 2, and the lines C—C and D—D in FIGS. 23A and 23B correspond to the lines A—A and B—B in FIG. 2 respectively.

The MOSFET 200 is characteristically different from the MOSFET 100 in a point that relations between shapes and sizes of openings 211, 212 and 212a described later are optimized.

In this MOSFET 200, a gate electrode 106 which is made of polysilicon is arranged on an upper major surface of a semiconductor substrate 160 through a gate insulating film 105 which is formed by a silicon oxide film. The gate electrode 106 is provided with gate openings 213 for respective unit cells, so that opening edges thereof are positioned immediately on or somewhat inside outer edges of $n^+$ emitter layers 104. Namely, the gate electrode 106 is arranged to cover channel regions 161 in the respective unit cells. The gate electrode 106 is provided with another type of gate openings 213a in the gate wire region. The gate openings 213a are provided in a region of a p well 103a.

The gate electrode 106 is covered with a protective film 207 which is formed by a silicon oxide film. This protective film 207 is provided with openings 212 inside the gate openings 213. A source electrode 208 is connected to upper surfaces of the n$^+$ emitter layers 104 and those of p base layers 103 which are held by the n$^+$ emitter layers 104 every unit cell.

The protective film 207 is further provided with openings 212a inside the gate openings 213a. The source electrode 208 is connected to the upper surface of the p well 103a through the openings 212a. The source electrode 208 is electrically insulated from the gate electrode 106 by the protective film 207.

The protective film 207 is further provided with openings 211 in positions corresponding to those immediately above the p well 103a. A gate wire 209 is connected to the gate electrode 106 through the openings 211. The gate wire 209 is electrically insulated from the source electrode 208. Both of the source electrode 208 and the gate wire 209 are made of conductive Al-Si.

In this MOSFET 200, conduction and disconnection of a main current, i.e., a switching operation, is implemented by adjusting the value of a gate voltage $V_{GS}$ which is applied across the gate electrode 106 and the source electrode 208 through a gate pad GP while positively applying a drain voltage $V_{DS}$ across a drain electrode 110 and the source electrode 208, similarly to the MOSFET 100.

<2-2. Fabrication Steps for the Device>

FIGS. 25A to 28B are step diagrams showing steps of fabricating the MOSFET 200. The fabrication steps for the MOSFET 200 are now described with reference to these step diagrams. Among these step diagrams, FIGS. 25A to 28A show the section taken along the line C—C in the gate wire region similarly to FIG. 24A, and FIGS. 25B to 28B show the section taken along the line D—D in the cell region similarly to FIG. 24B.

In order to fabricate the MOSFET 200, steps corresponding to those shown in FIGS. 4A to 15B in the fabrication method according to the first embodiment are first carried out. Thereafter the gate electrode 106 is provided with the gate openings 213a and 213 above the p well 103a and above an n$^-$-type semiconductor layer 102 in the cell region respectively.

Figure 25A:
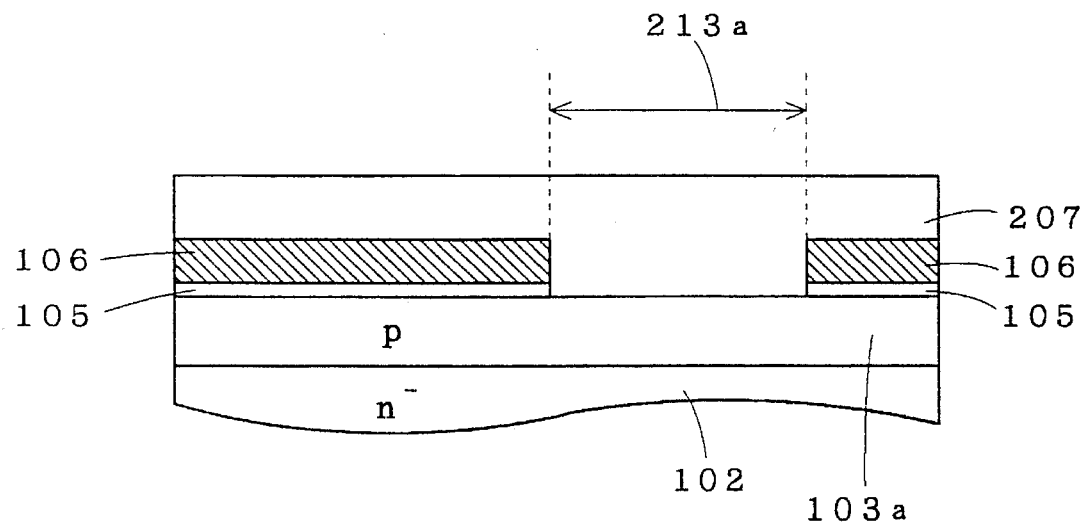
FIGS. 25A and 25B are fabrication step diagrams of the MOSFET according to the second embodiment of the present invention.
Figure 25B:
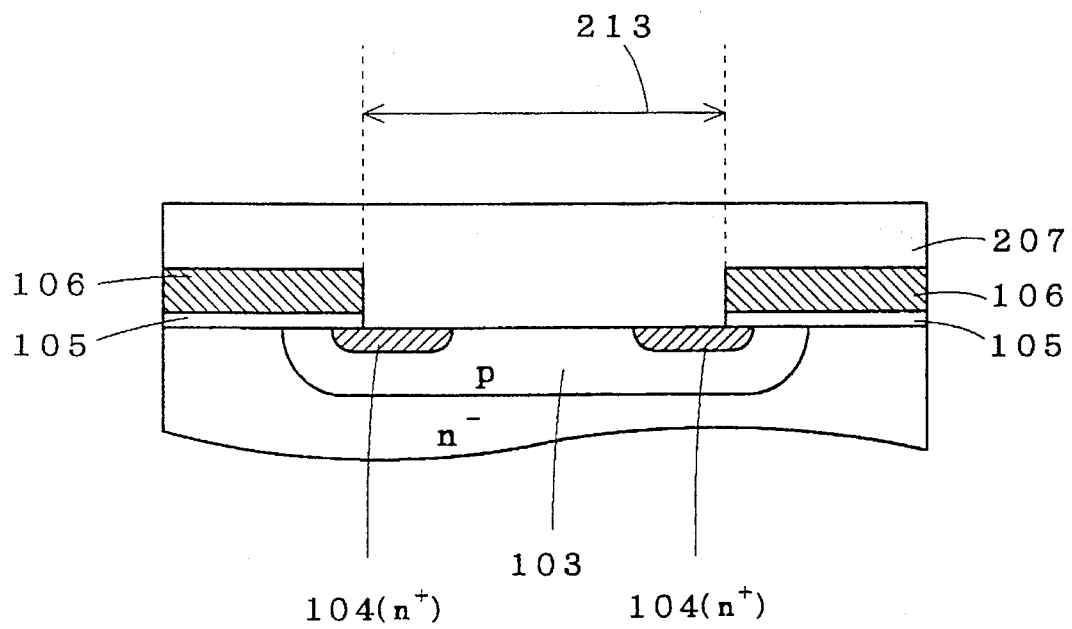

Thereafter the protective film 207 is formed by depositing SiO$_2$, for example, to cover an upper major surface of a semiconductor substrate 160, the gate insulating film 105, and the overall upper surface of the gate electrode 106, as shown in FIGS. 25A and 25B. At this time, the gate insulating film 105 remaining on upper surfaces of p$^+$ layers 135 in the cell region are integrated with the protective film 207. Through this step, both of the gate openings 213 and 213a are covered with the protective film 207.

Figure 26A:
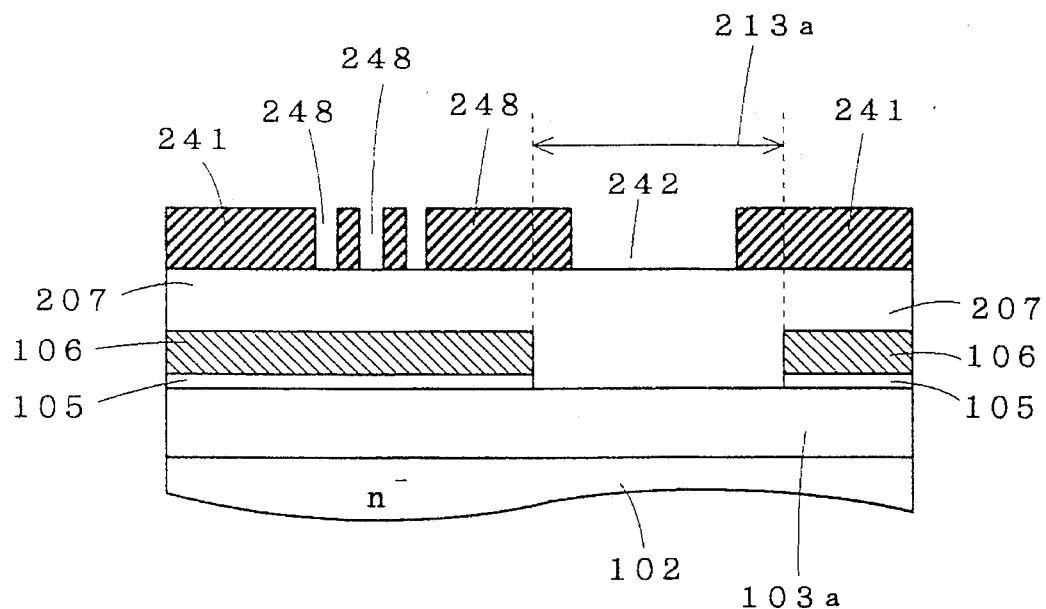
FIGS. 26A and 26B are fabrication step diagrams of the MOSFET according to the second embodiment of the present invention.
Figure 26B:
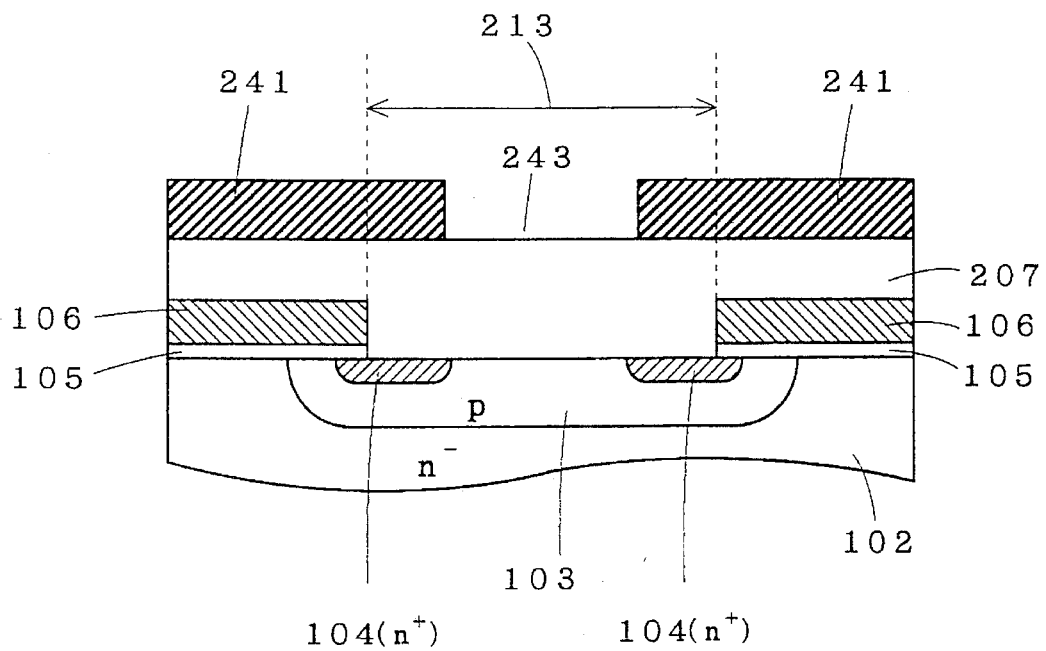

Then, a new resist film 241 is temporarily applied to the overall upper surface of the protective film 207, as shown in FIGS. 26A and 26B. Thereafter the resist film 241 is provided with openings 242 and 248 above central portions of the gate openings 213a in the gate wire region and above the gate electrode 106 in the gate wire region by photolithography respectively. At the same time, openings 243 are formed above central portions of the gate openings 213 in the cell region.

At this time, opening areas of the openings 248 are set to be smaller than those of the remaining openings 243 and 242. For example, all of the openings 248, 243 and 242 are set in rectangular shapes to be 1.5 μm by 1.5 μm to 2.5 μm by 2.5 μm, about 3 μm by 3 μm, and about 4 μm by 10 μm respectively, for example.

Figure 27A:
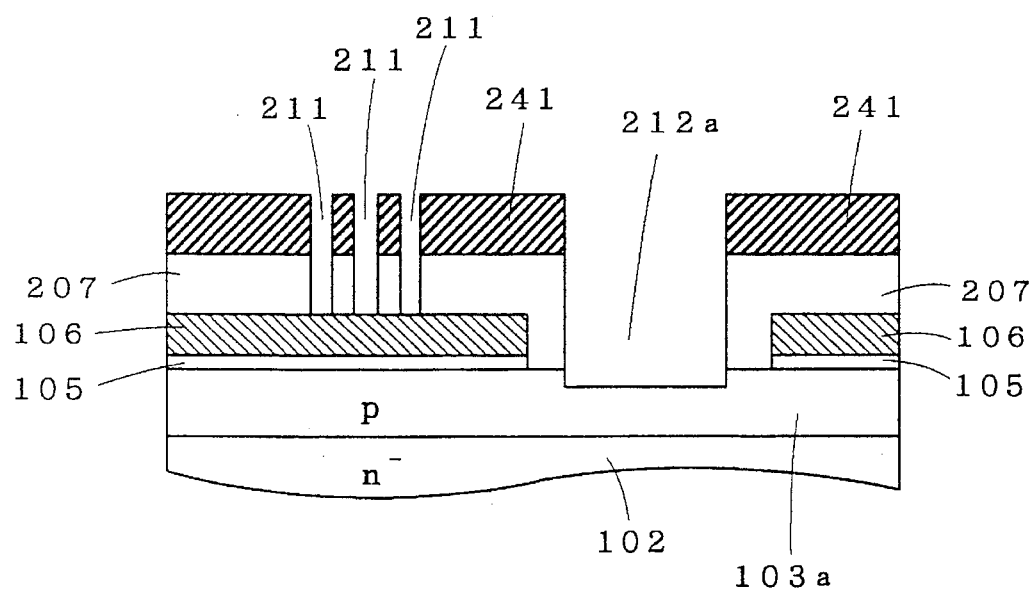
FIGS. 27A and 27B are fabrication step diagrams of the MOSFET according to the second embodiment of the present invention.
Figure 27B:
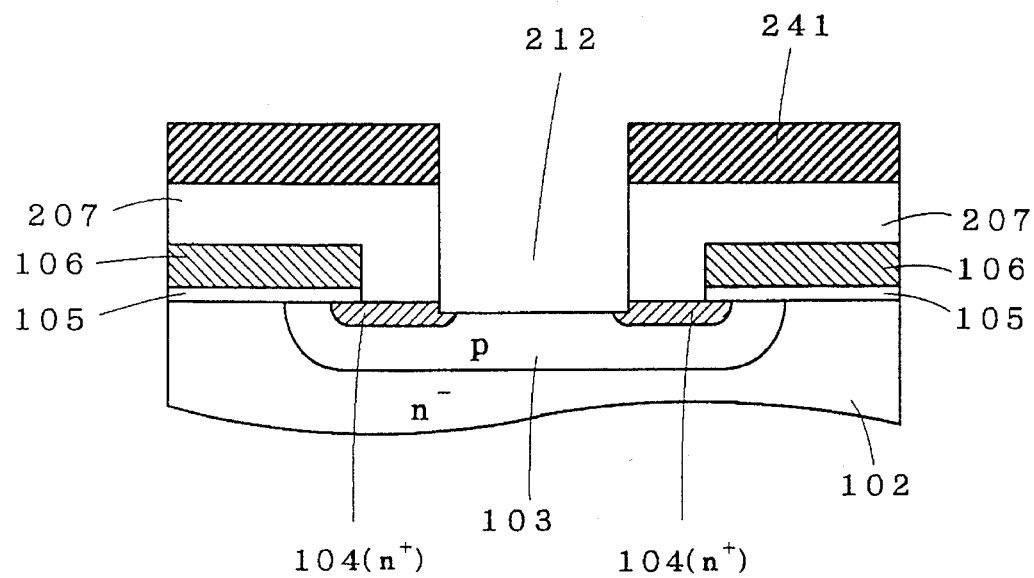

Then, the resist film 241 is employed as a screen for selectively etching the protective film 207, as shown in FIGS. 27A and 27B. This etching is carried out by dry etching such as RIE, for example. At this time, the etching is carried out until the upper major surface of the semiconductor substrate 160 is slightly etched down in portions immediately under the openings 242 and 243.

Thus, the openings 212a and 212 of the protective film 207 are formed immediately under the openings 242 and 243 of the resist film 241 respectively. Consequently, inner side portions of the n$^+$ emitter layers 104 and the p$^+$ layers 135 which are held by the n$^+$ layers 104 are exposed in the openings 212. Further, the upper major surface of the p well 103a is exposed in the openings 212a.

In addition, the openings 211 of the protective film 207 are formed immediately under the openings 248 of the resist film 241. Consequently, the upper surface of the gate electrode 106 is exposed in the openings 211. At this time, the gate electrode 106 is hardly etched down, since the sizes of the openings 248 are set at proper values which are smaller than those of the remaining openings 242 and 243.

The amount of etching in the dry etching step so depends on the sizes of the openings that the former is increased as the latter are increased. This fact is well known in the art as a "loading effect" in dry etching. The aforementioned examples in relation to the sizes of the openings 248, 243 and 242 utilize this loading effect. Namely, the sizes and the shapes of the openings 248, 243 and 242 are so set that the semiconductor substrate 160 is properly etched down in the openings 212 and 213, and the gate electrode 106 is not etched down in the openings 211.

Since the p well 103a is formed to be deeper than the p base layers 103, the etch-down operation in the openings 212a may be carried out more deeply than that in the openings 212. Therefore, the openings 242 are set to be larger than the openings 243 in the aforementioned set examples. The sizes of the openings 211, 212 and 212a coincide with the openings 248, 243 and 242 of the resist film 241 respectively.

Figure 28A:
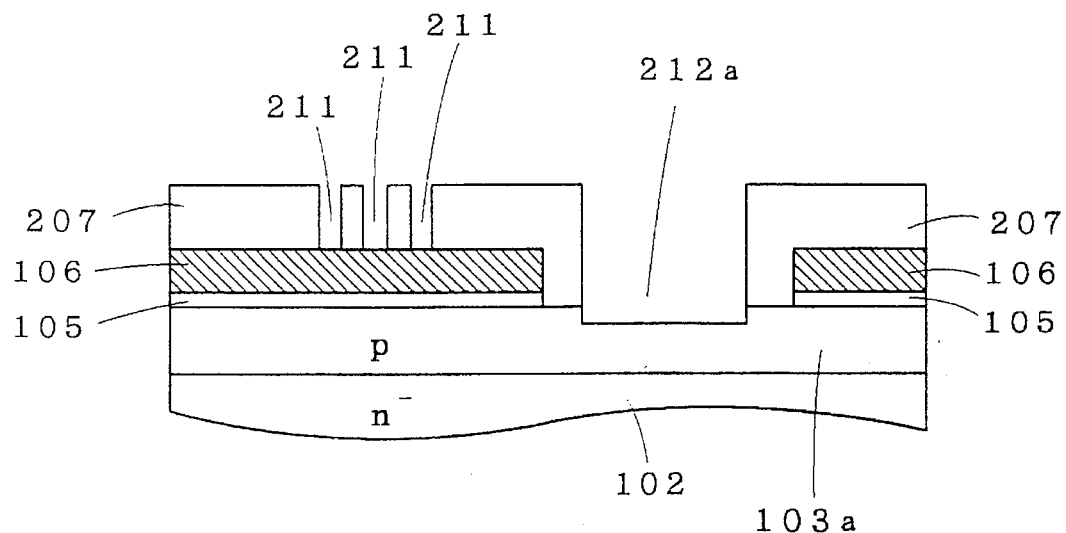
FIGS. 28A and 28B are fabrication step diagrams of the MOSFET according to the second embodiment of the present invention.
Figure 28B:
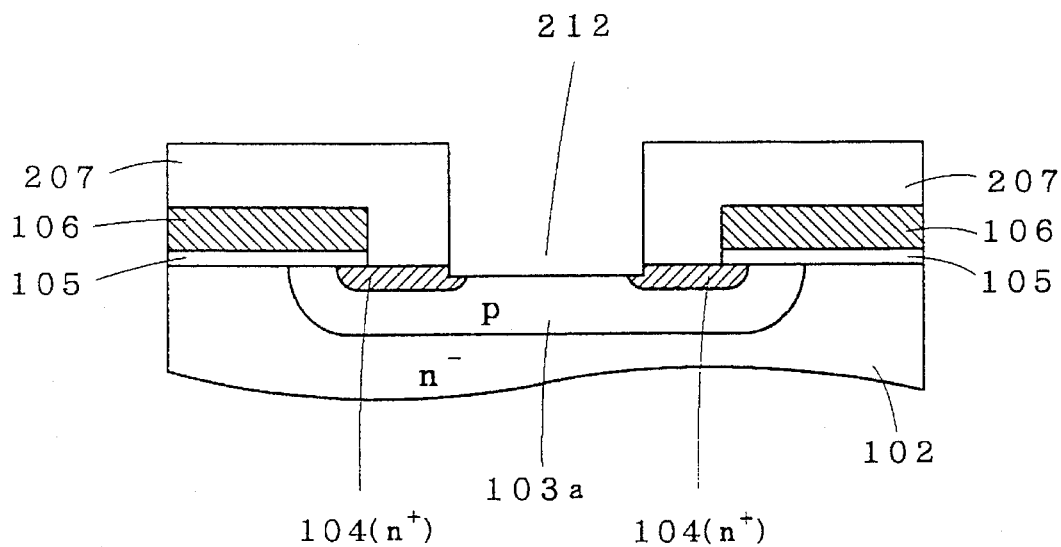

Then, the resist film 241 is removed as shown in FIGS. 28A and 28B.

Referring again to FIGS. 23A and 23B, Al-Si is deposited on the openings 211, 212a and 212 and the overall upper surface of the protective film 207 by sputtering or vapor deposition, for example, and thereafter selective removal is carried out by photolithography, thereby forming the source electrode 208 and the gate wire 209. Further, Ti/Ni/Au, for example, is deposited on the overall lower major surface of the semiconductor substrate 160, i.e., the overall lower major surface of an n$^+$-type semiconductor layer 101, thereby forming a drain electrode 110. The MOSFET 200 is completed through the aforementioned steps.

In the fabrication method according to this embodiment, the openings 212 and 212a are formed by dry etching, whereby insulation between the source electrode 208 and the gate electrode 106 is reliably guaranteed similarly to the conventional MOSFET 50, so that it is possible to reduce the percentage of defectiveness resulting from defective insulation in these portions. Further, the upper major surface of the semiconductor substrate 160 is etched down in the openings 212, whereby a high switching rate is attained while it is possible to suppress a latch-up phenomenon caused by conduction of parasitic bipolar transistors.

In addition, the opening areas of the openings 211 are set at proper values which are smaller than those of the remaining openings 212 and 211a, whereby the amount of etching in the openings 212 is properly suppressed by the loading effect. Thus, it is possible to allow the upper major surface of the semiconductor substrate 160 to be properly etched down in the openings 212 and 211a while avoiding the gate electrode 106 from being etched down in the openings 211, by stopping the etching step at the point of time when the etching progresses to expose the gate electrode 106 in the openings 211.

Consequently, reduction of the switching rate caused by an etch-down phenomenon of the gate electrode 106 is prevented, while it is possible to prevent defectiveness of the product caused by defective insulation of the gate insulating film 105.

Namely, it is possible to attain an effect of preventing the gate electrode 106 from being etched down while guaranteeing insulation between the gate electrode 106 and the source electrode 208, which cannot be attained in the conventional fabrication method, also in the fabrication method of this embodiment, similarly to the fabrication method according to the first embodiment. In addition, all of the three types of openings 211, 212 and 212a are formed by a single etching step employing the same resist film in the fabrication method according to this embodiment. Therefore, the fabrication steps are simple and the fabrication cost is reduced in response thereto.

<3. Third Embodiment>

A third embodiment of the present invention is now described.

<3-1. Structure and Operation of Device>

Figure 29A:
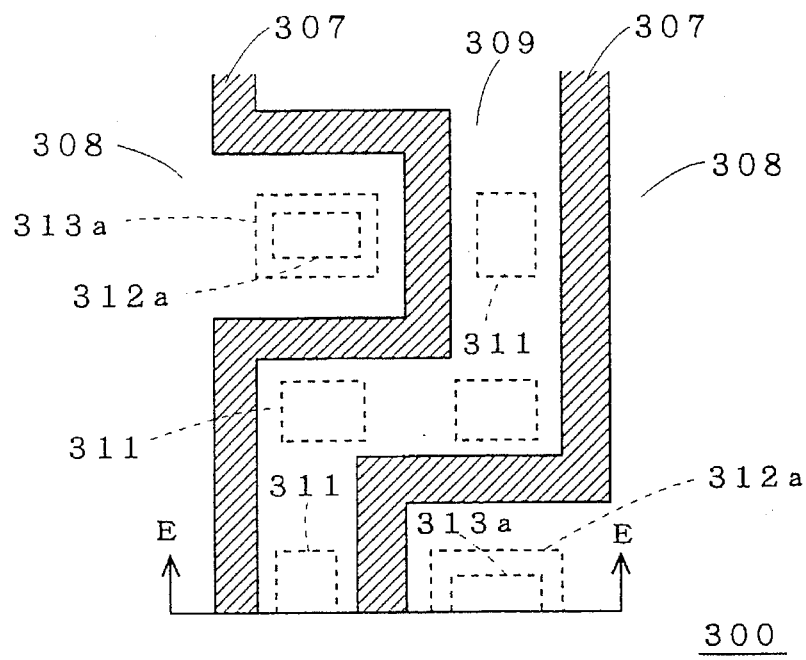
FIGS. 29A and 29B are enlarged partial plan views showing a MOSFET according to a third embodiment of the present invention.
Figure 29B:
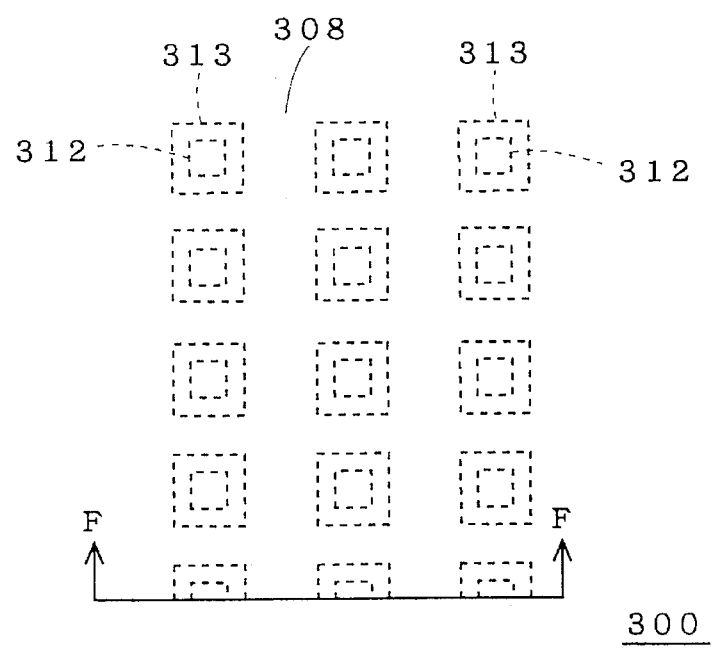
Figure 30A:
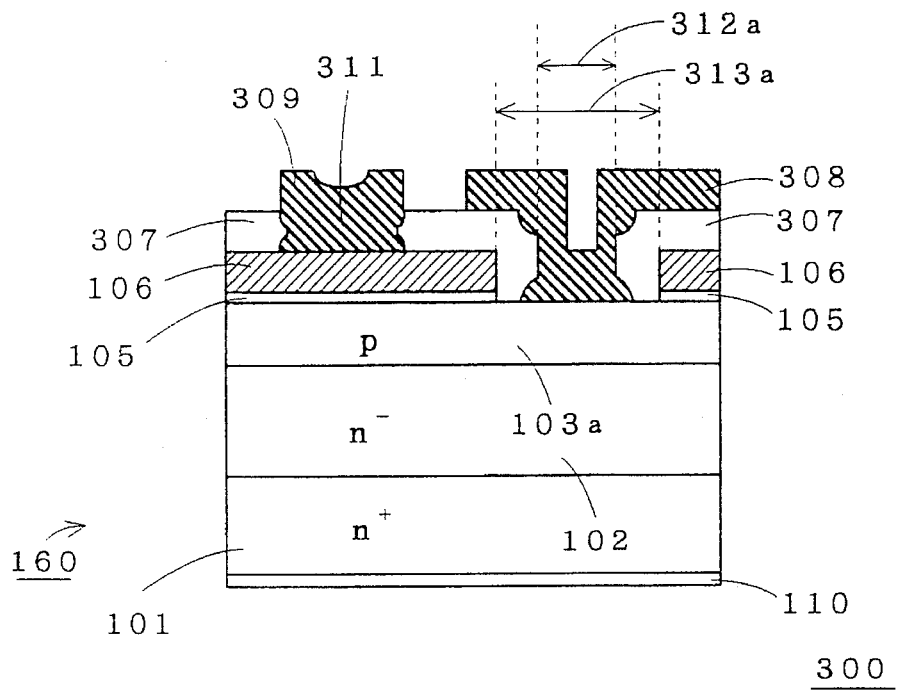
FIGS. 30A and 30B are front sectional views showing the MOSFET according to the third embodiment of the present invention.
Figure 30B:
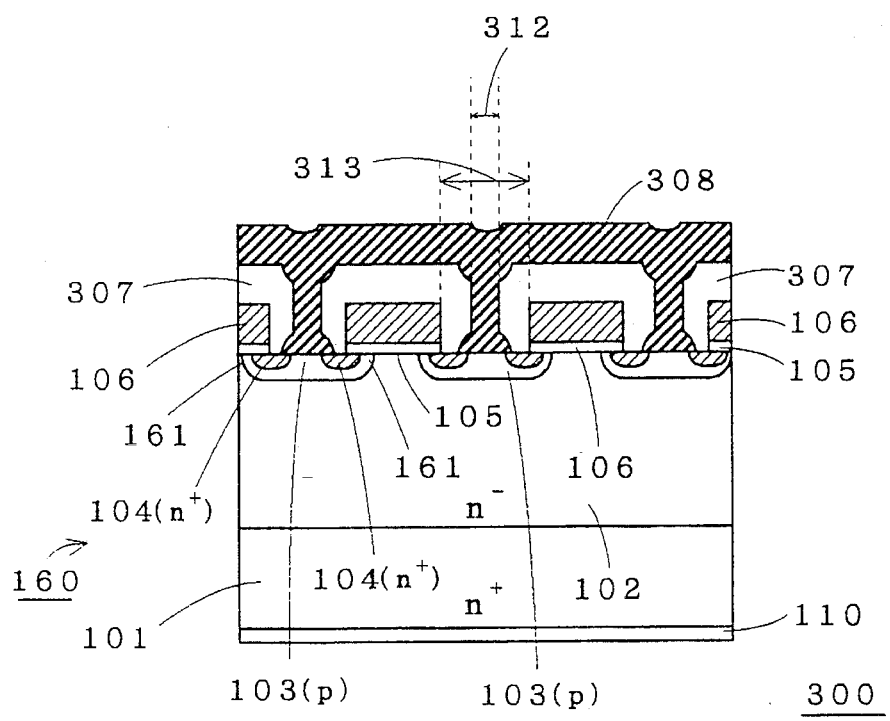

FIGS. 29A and 29B are enlarged partial plan views showing a MOSFET 300 according to this embodiment, and FIGS. 30A and 30B are partial sectional views thereof. FIGS. 29A and 29A correspond to a gate wire region, and FIGS. 30B and 30B correspond to a cell region. Further, FIGS. 30A and 30B are sectional views taken along the lines E—E and F—F in FIGS. 29A and 29B respectively. A general plan view of the MOSFET 300 is expressed similarly to FIG. 2, and the lines E—E and F—F in FIGS. 29A and 29B correspond to the lines A—A and B—B in FIG. 2 respectively.

The MOSFET 300 is characteristically different from the MOSFETs 100 and 200 in a point that openings 311, 312 and 312a described later are formed in three stages of different etching methods of wet etching, dry etching and wet etching.

In this MOSFET 300, a gate electrode 106 which is made of polysilicon is arranged on an upper major surface of a semiconductor substrate 160 through a gate insulating film 105 which is formed by a silicon oxide film. The gate electrode 106 is provided with gate openings 313 for respective unit cells, so that opening edges thereof are positioned immediately on or somewhat inside outer edges of $n^+$ emitter layers 104. Namely, the gate electrode 106 is arranged to cover channel regions 161 in the respective unit cells. The gate electrode 106 is provided with another type of gate openings 313a in the gate wire region. The gate openings 313a are provided in a region of a p well 103a.

The gate electrode 106 is covered with a protective film 307 which is formed by a silicon oxide film. This protective film 307 is provided with openings 312 inside the gate openings 313. A source electrode 308 is connected to upper surfaces of the $n^+$ emitter layers 104 and those of p base layers 103 which are held by the $n^+$ emitter layers 104 every unit cell.

The protective film 307 is further provided with openings 312a inside the gate openings 313a. The source electrode 308 is connected to the upper surface of the p well 103a through the openings 312a. The source electrode 308 is electrically insulated from the gate electrode 106 by the protective film 307.

The protective film 307 is further provided with openings 311 in positions corresponding to those immediately above the p well 103a. A gate wire 309 is connected to the gate electrode 106 through the openings 311. The gate wire 309 is electrically insulated from the source electrode 308. Both of the source electrode 308 and the gate wire 309 are made of conductive Al-Si.

In this MOSFET 300, conduction and disconnection of a main current, i.e., a switching operation, is implemented by adjusting the value of a gate voltage $V_{GS}$ which is applied across the gate electrode 106 and the source electrode 308 through a gate pad GP while positively applying a drain voltage $V_{DS}$ across a drain electrode 110 and the source electrode 308, similarly to the MOSFETs 100 and 200.

<3-2. Fabrication Steps for the Device>

FIGS. 31A to 36B are step diagrams showing steps of fabricating the MOSFET 300. The fabrication steps for the MOSFET 300 are now described with reference to these step diagrams. Among these step diagrams, FIGS. 31A to 36A show the section taken along the line C—C in the gate wire region similarly to FIG. 30A, while FIGS. 31B to 36B show the section taken along the line C—C in the cell region similarly to FIG. 30B.

In order to fabricate the MOSFET 300, steps corresponding to those shown in FIGS. 4A to 15B in the fabrication method according to the first embodiment are first carried out. Thereafter the gate electrode 106 is provided with the gate openings 313a and 313 above the p well 103a and above an $n^-$-type semiconductor layer 102 in the cell region respectively.

Figure 31A:
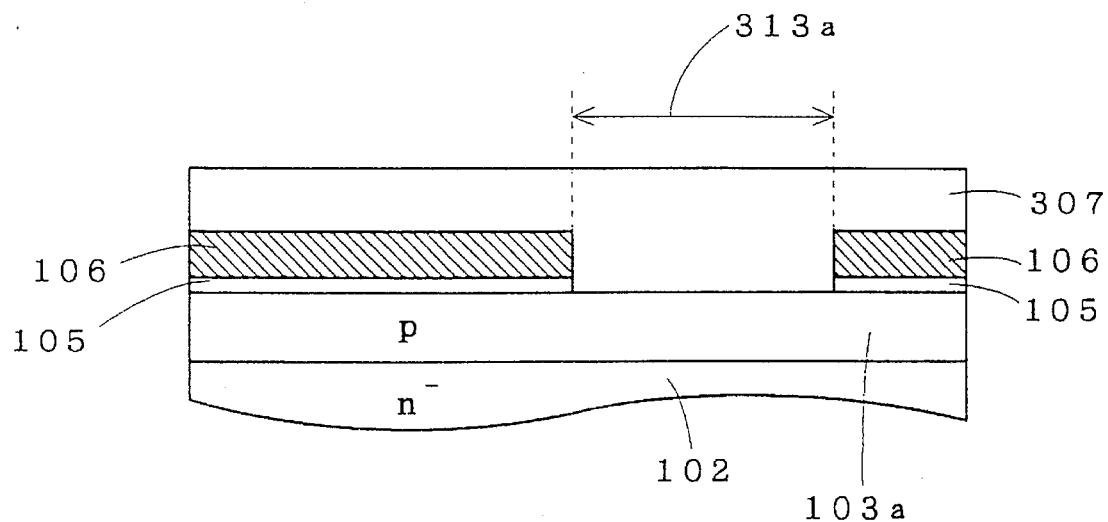
FIGS. 31A and 31B are fabrication step diagrams of the MOSFET according to the third embodiment of the present invention.
Figure 31B:
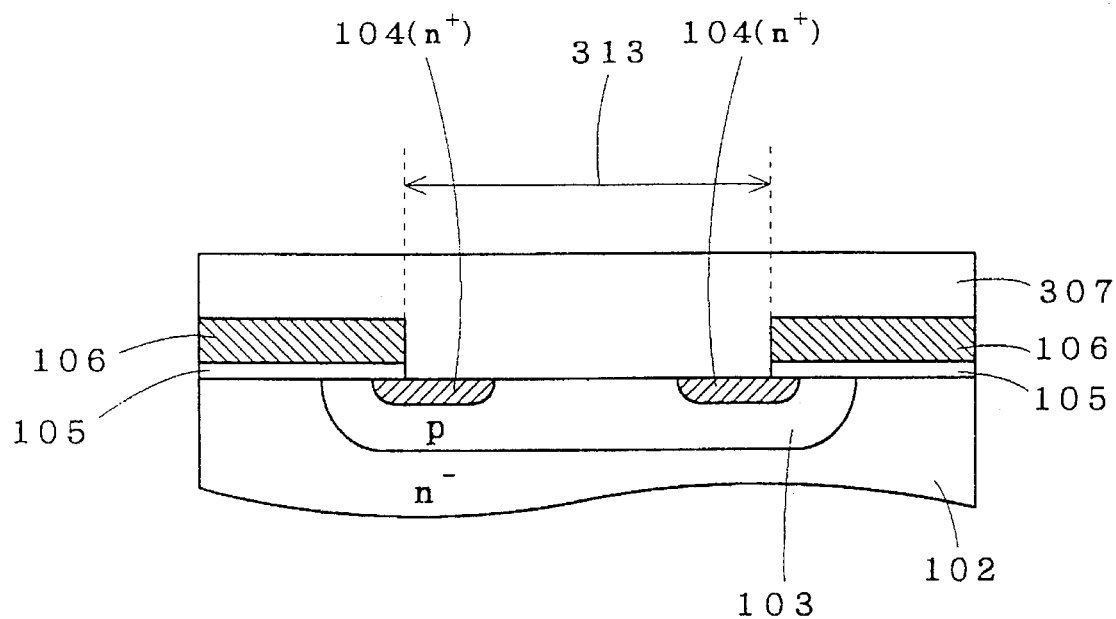

Thereafter the protective film 307 is formed by depositing $SiO_2$, for example, to cover an upper major surface of a semiconductor substrate 160, the gate insulating film 105, and the overall upper surface of the gate electrode 106, as shown in FIGS. 31A and 31B. At this time, the gate insulating film 105 remaining on upper surfaces of $p^+$ layers 135 in the cell region are integrated with the protective film 307. Through this step, both of the gate openings 313 and 313a are covered with the protective film 307.

Figure 32A:
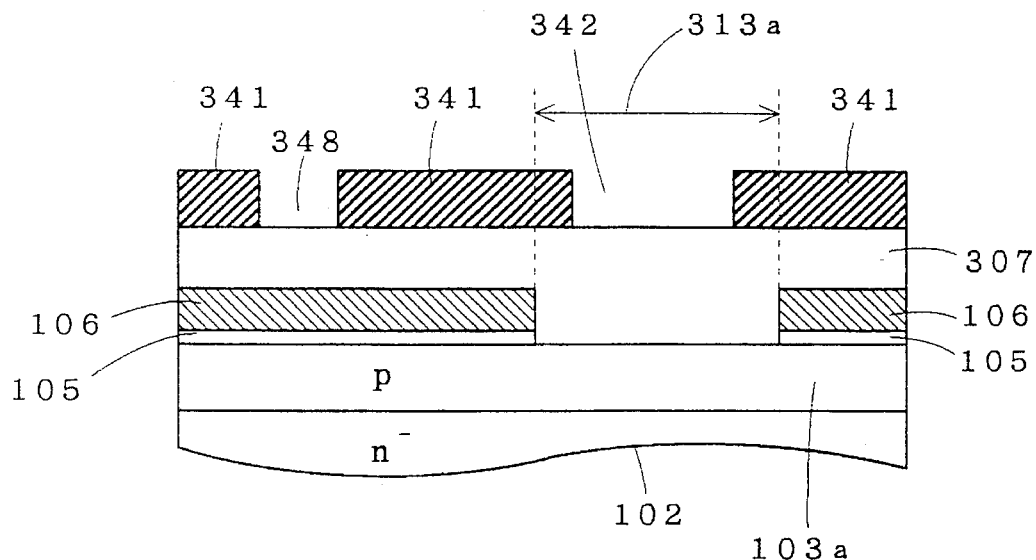
FIGS. 32A and 32B are fabrication step diagrams of the MOSFET according to the third embodiment of the present invention.
Figure 32B:
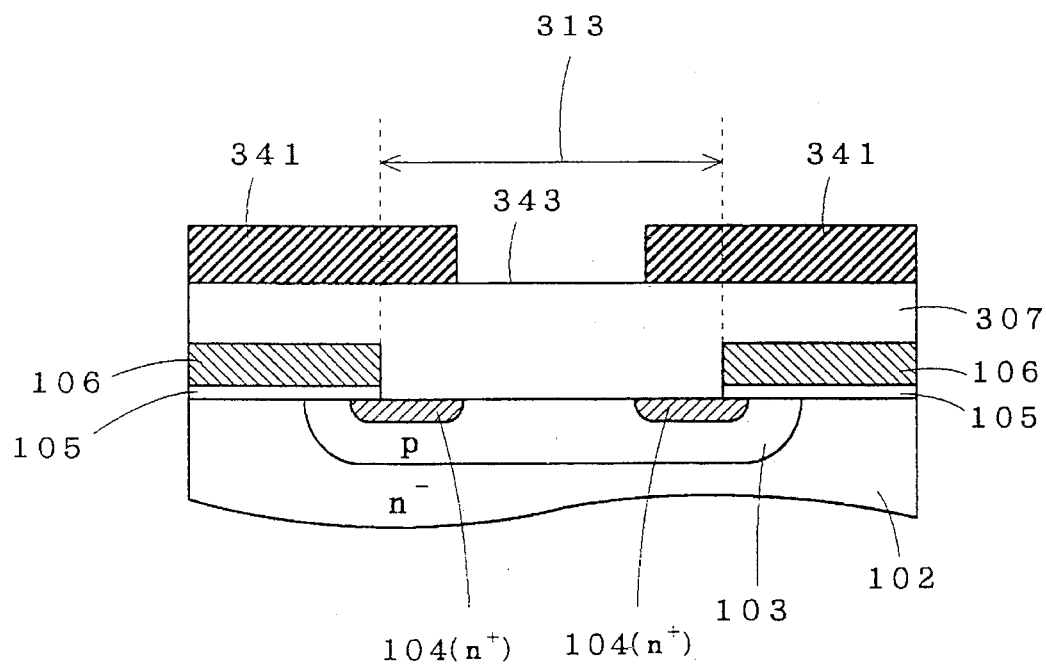

Then, a new resist film 341 is temporarily applied onto the overall upper surface of the protective film 307, as shown in FIGS. 32A and 32B. Thereafter the resist film 341 is provided with openings 342 and 348 above central portions of the gate openings 313a and above the gate electrode 106 in the gate wire region by photolithography respectively. At the same time, openings 343 are formed above central portions of the gate openings 313 in the cell region.

Figure 33A:
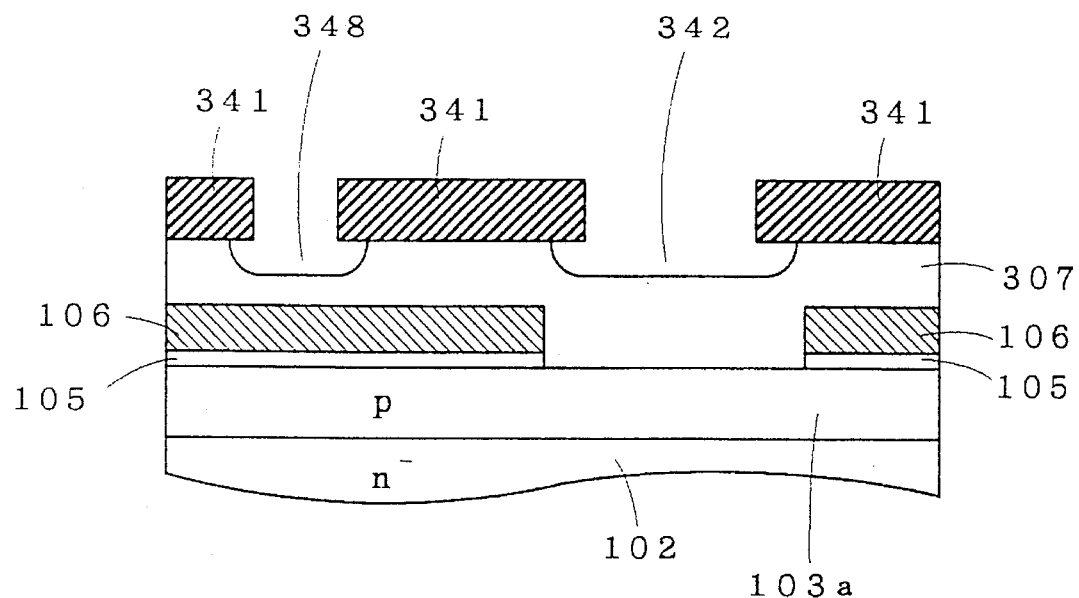
FIGS. 33A and 33B are fabrication step diagrams of the MOSFET according to the third embodiment of the present invention.
Figure 33B:
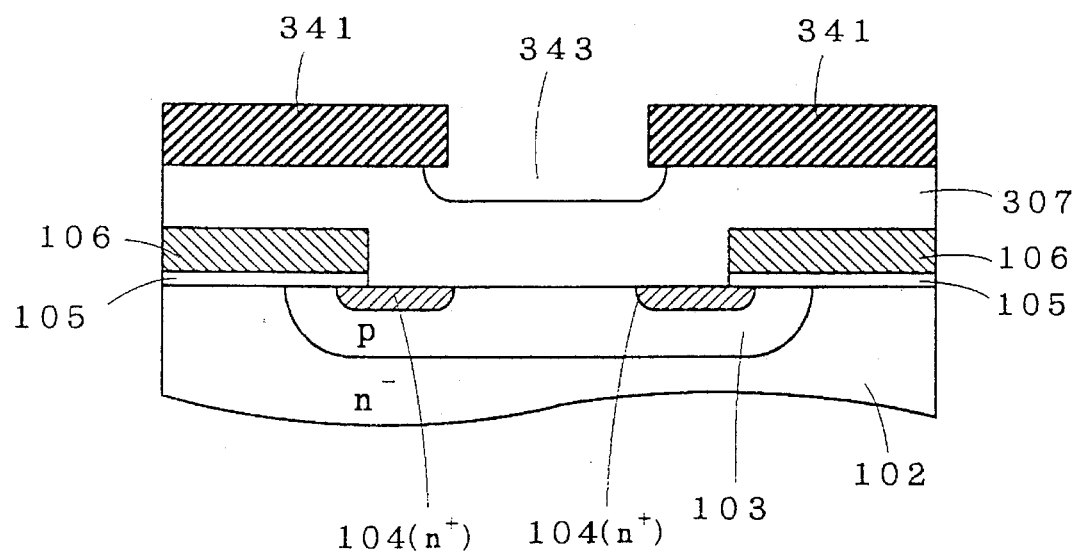

Then, the resist film 341 is employed as a screen to selectively carry out wet etching on the protective film 307, as shown in FIGS. 33A and 33B. Consequently, the protective film 307 is selectively removed in portions immediately under the openings 348, 342 and 343. This etching step is stopped when the etching reaches a depth of about 0.01 to 0.02 μm. Therefore, neither the semiconductor substrate 160 nor the gate electrode 106 is exposed in this etching step. A hydrofluoric acid etchant is employed in this etching step, for example.

Figure 34A:
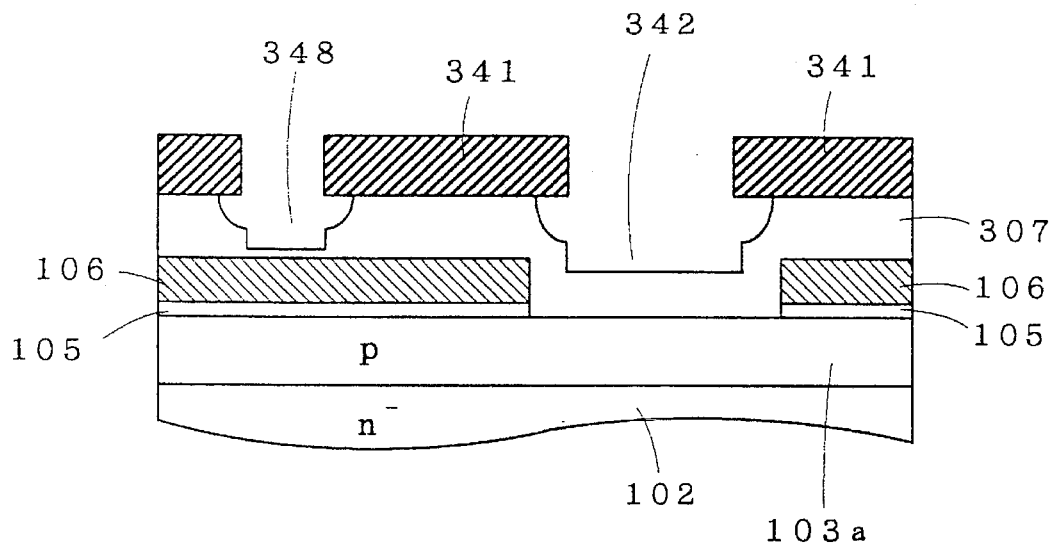
FIGS. 34A and 34B are fabrication step diagrams of the MOSFET according to the third embodiment of the present invention.
Figure 34B:
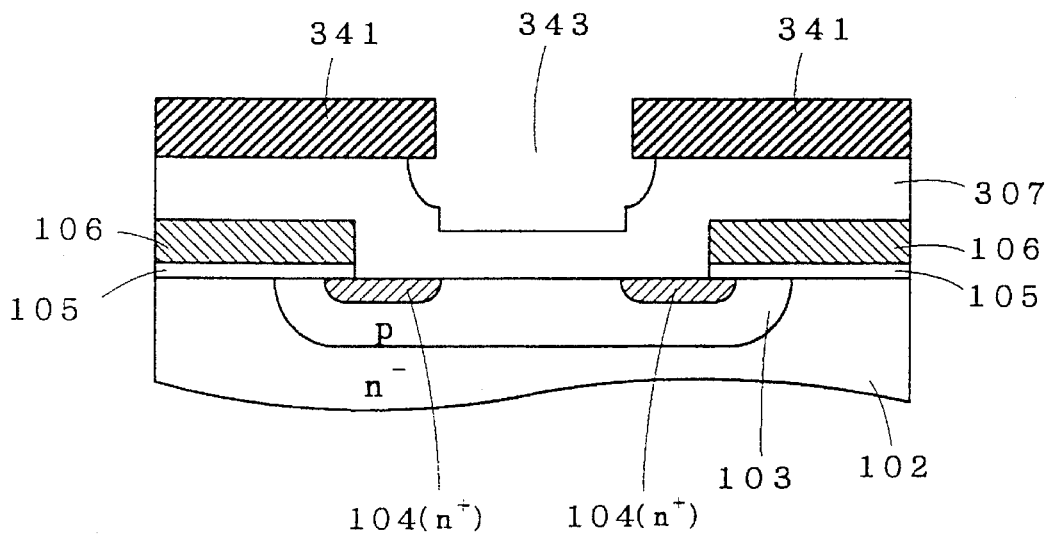

Then, the resist film 341 is employed as a screen to selectively carry out dry etching on the protective film 307, as shown in FIGS. 34A and 34B. This dry etching is carried out by RIE, for example. Consequently, selective removal of the protective film 307 further progresses in the portions immediately under the openings 348, 342 and 343. This etching step is stopped when the thicknesses of portions of the protective film 307 remaining in the portions immediately under the openings 348 reach 0.01 to 0.02 μm. Therefore, neither the gate electrode 106 nor the semiconductor substrate 160 is exposed in this etching step either.

Figure 35A:
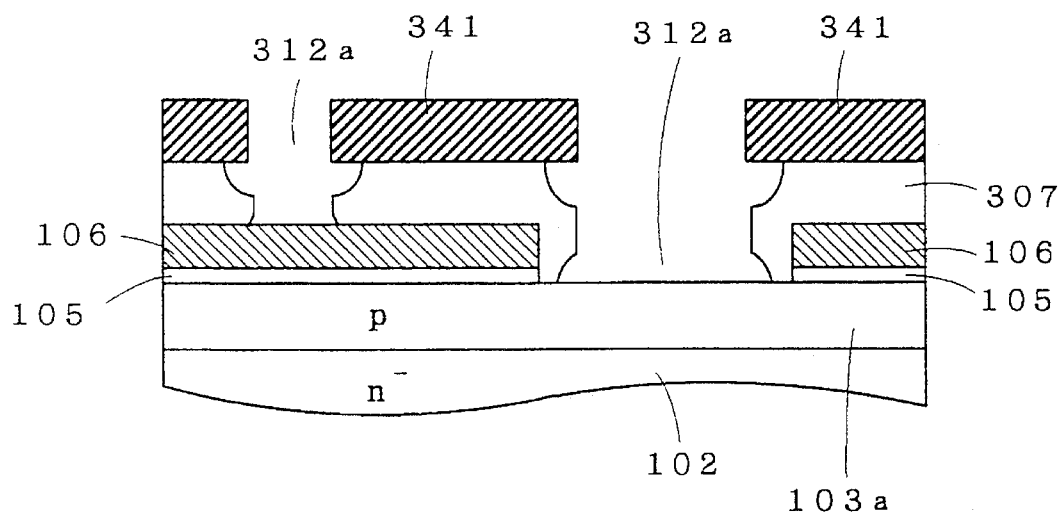
FIGS. 35A and 35B are fabrication step diagrams of the MOSFET according to the third embodiment of the present invention.
Figure 35B:
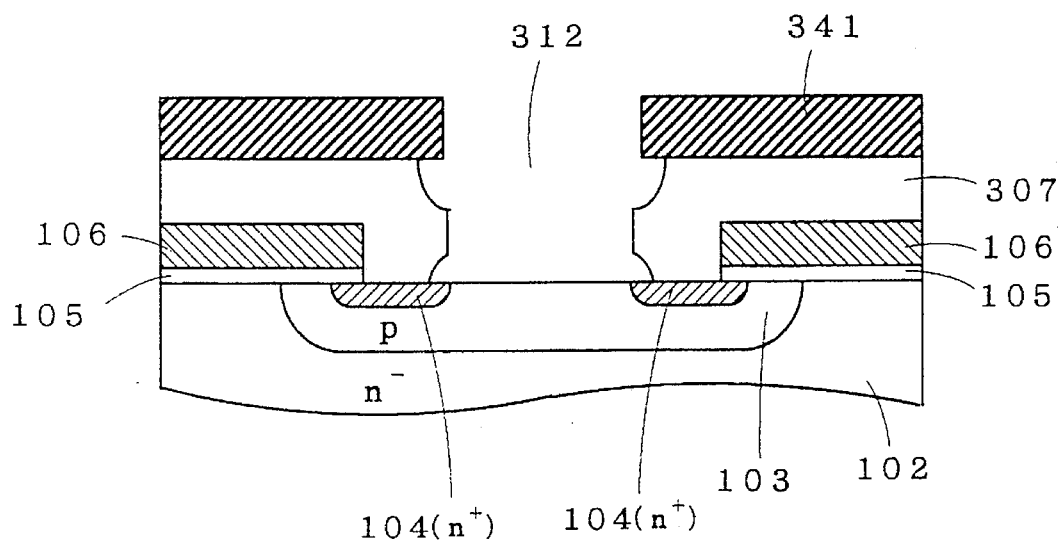

Then, the resist film 341 is employed as a screen to again selectively carry out wet etching on the protective film 307, as shown in FIGS. 35A and 35B. Thus, the openings 312a and 312 of the protective film 307 are formed immediately under the openings 342 and 343 of the resist film 341 respectively. Consequently, inner side portions of the $n^+$ emitter layers 104 and the $p^+$ layers 135 which are held by the $n^+$ layers 104 are exposed in the openings 312. Further, the upper major surface of the p well 103a is exposed in the openings 312a. In addition, the openings 311 of the protective film 307 are formed immediately under the openings 348 of the resist film 341. Consequently, the upper surface of the gate electrode 106 is exposed in the opening 311.

A hydrofluoric acid etchant is employed for this etching step. Therefore, the etchant will not act on the gate electrode 106 which is made of polysilicon, whereby the gate electrode 106 is not unnecessarily etched down. Further, the etchant will not act on the semiconductor substrate 160 either, whereby the semiconductor substrate 160 which is made of single-crystalline silicon is not etched down either.

Figure 36A:
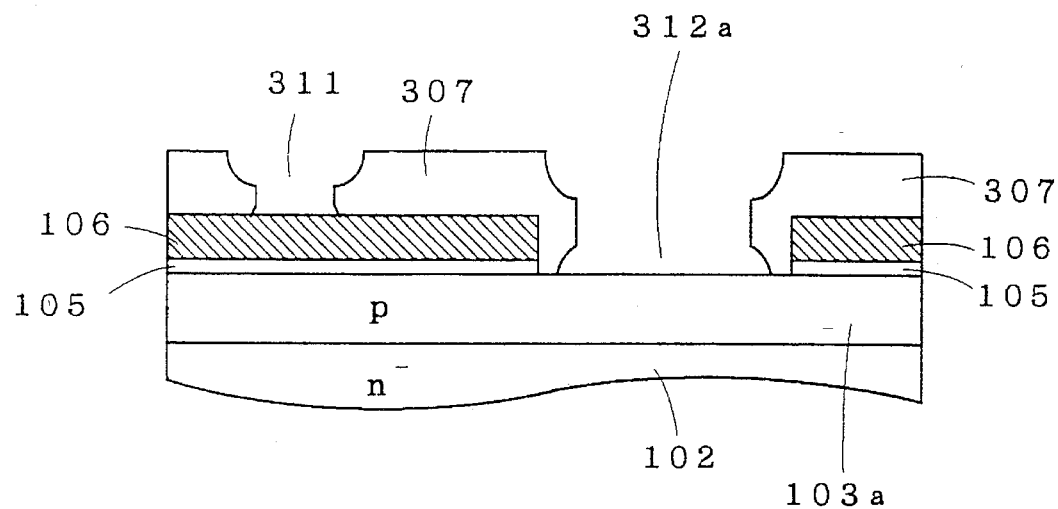
FIGS. 36A and 36B are fabrication step diagrams of the MOSFET according to the third embodiment of the present invention.
Figure 36B:
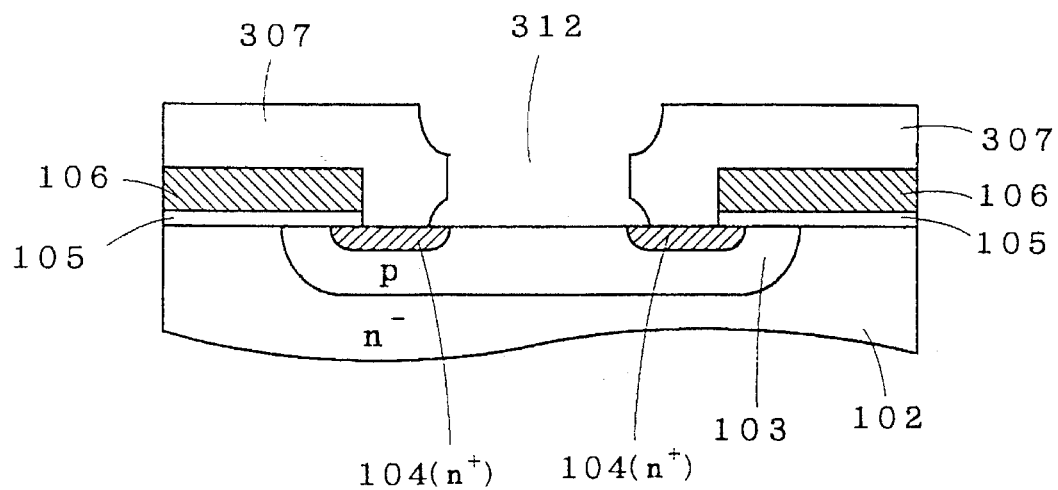
Figure 37:
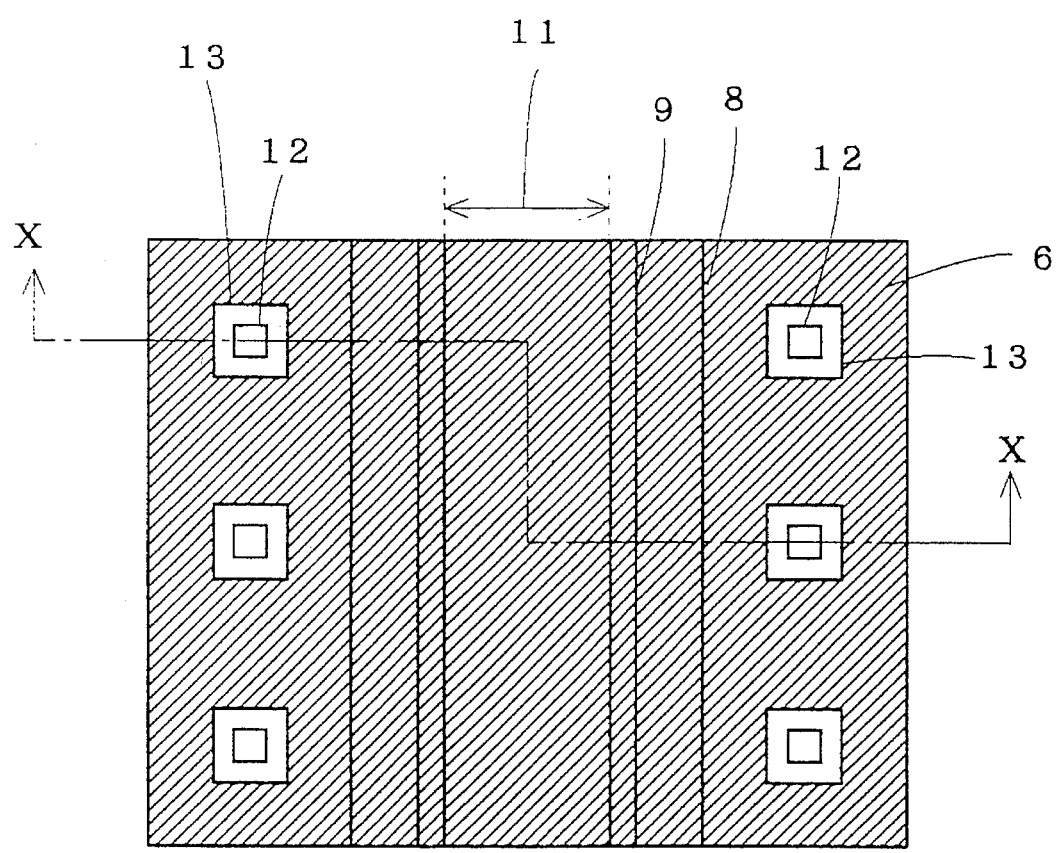
FIG. 37 is an enlarged plan view showing a conventional MOSFET.
Figure 38:
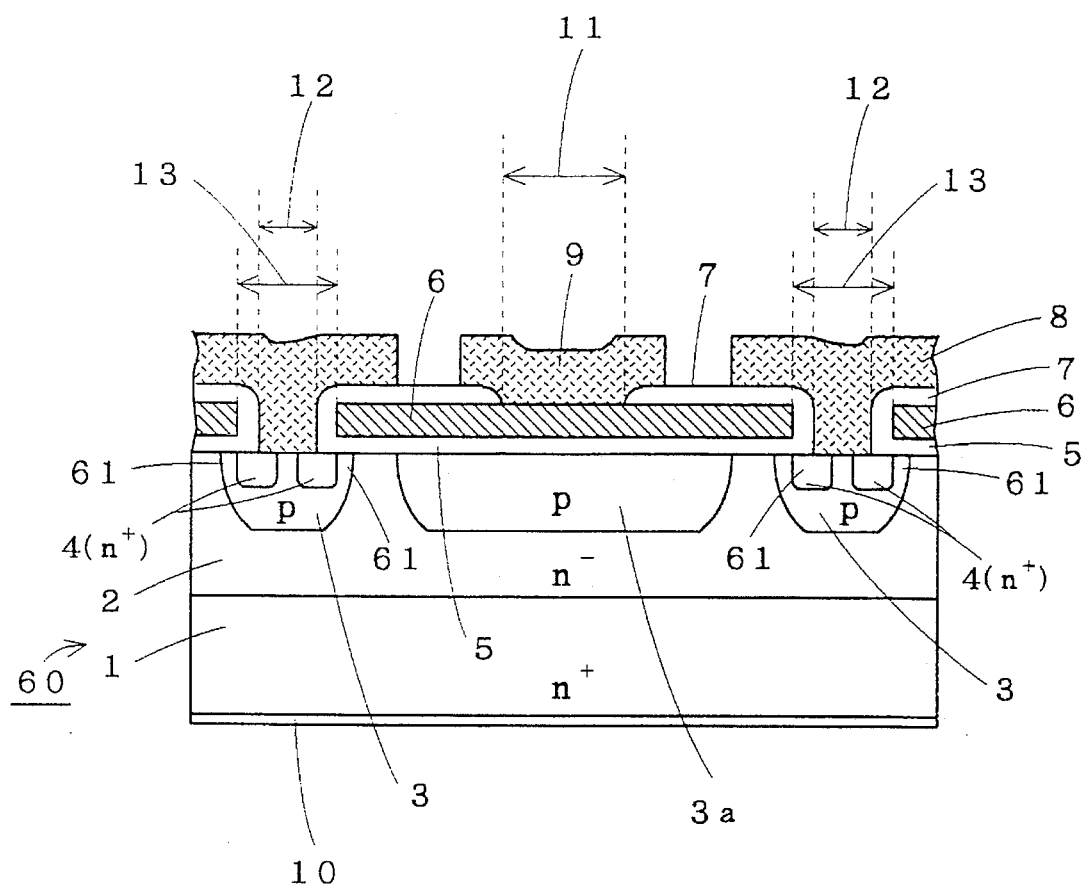
FIG. 38 is a front sectional view showing the conventional MOSFET.
Figure 39:
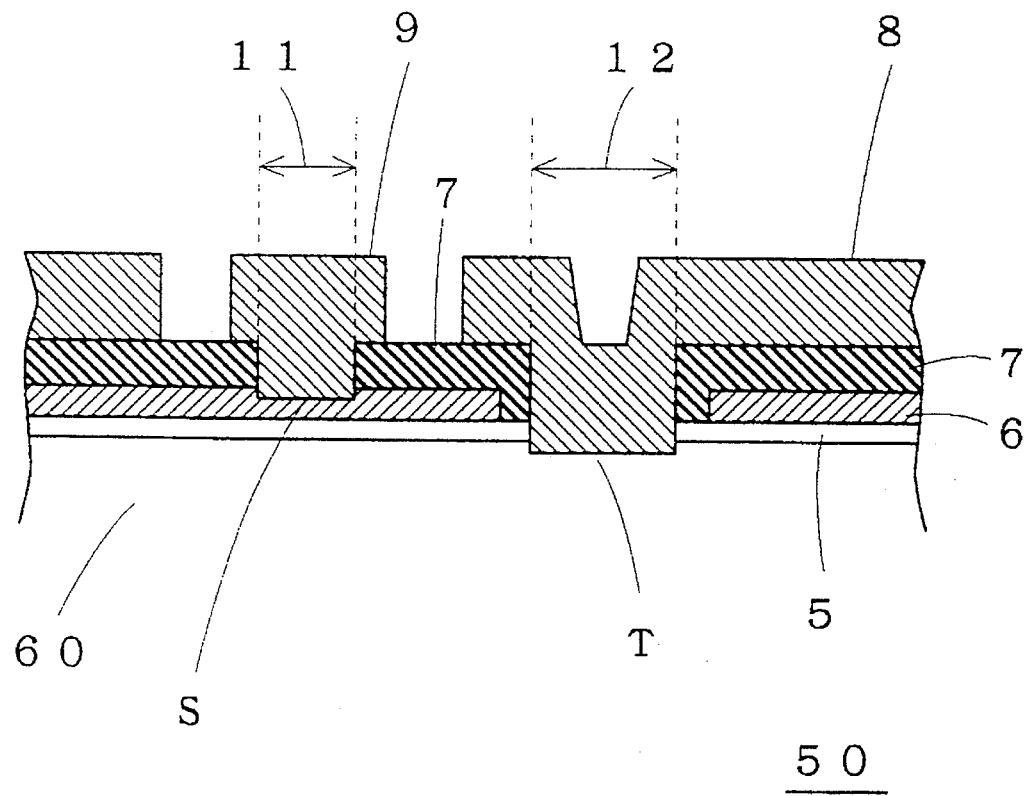
FIG. 39 is an enlarged front sectional view showing the conventional MOSFET.

Then, the resist film 341 is removed as shown in FIGS. 36A and 36B.

Referring again to FIGS. 30A and 30B, Al-Si is deposited on the openings 311, 312a and 312 and the overall upper surface of the protective film 307 by sputtering or vapor deposition, for example, and thereafter selective removal is carried out by photolithography thereby forming the source electrode 308 and the gate wire 309. Further, Ti/Ni/Au, for example, is deposited on the overall lower major surface of the semiconductor substrate 160, i.e., the overall lower major surface of an $n^+$-type semiconductor layer 101, thereby forming a drain electrode 110. The MOSFET 300 is completed through the aforementioned steps.

In the fabrication method according to this embodiment, principal portions excluding upper and lower ends of the openings 312 and 312a are formed by dry etching which is the second stage of the three-stage etching steps, whereby the openings 312 and 312a are not unnecessarily enlarged. Therefore, insulation between the source electrode 308 and the gate electrode 106 is reliably guaranteed similarly to the conventional MOSFET 50, so that it is possible to reduce the percentage of defectiveness resulting from defective insulation in these portions.

Further, wet etching is employed in the final stage of the etching step for forming the openings 311, whereby the gate electrode 106 is prevented from being etched down in the openings 311. Consequently, reduction of the switching rate caused by an etch-down phenomenon of the gate electrode 106 is prevented, while it is possible to prevent defectiveness of the product caused by defective insulation of the gate insulating film 105.

Namely, it is possible to attain an effect of preventing the gate electrode 106 from being etched down while guaranteeing insulation between the gate electrode 106 and the source electrode 308, which cannot be attained in the conventional fabrication method, also in the fabrication method of this embodiment, similarly to the fabrication methods according to the first and second embodiments.

Further, wet etching is first carried out in advance of the dry etching step which is a principal etching step in the fabrication method according to this embodiment, whereby upper edges of the openings 312 and 312a are properly smoothed. Therefore, the source electrode 308 is smoothly deposited in these openings 312 and 312a, whereby the so-called "step coverage" in the source electrode 308 is advantageously improved. In addition, all of the three types of openings 311, 312 and 312a are formed by etching steps employing the same resist film. Therefore, the fabrication steps are simple and the fabrication cost is reduced in response thereto.

<4. Modifications>

(1) While the etching steps are carried out in three stages of wet etching, dry etching and wet etching in the fabrication method according to the third embodiment, the first wet etching step may be omitted so that the etching steps are carried out in two stages of dry etching and wet etching. Also when the etching steps are carried out in this manner, it is possible to attain a similar effect of preventing the gate electrode 106 from being etched down while guaranteeing insulation between the gate electrode 106 and the source electrode 308.

(2) In the second embodiment, the openings 211 and the openings 212 and 211a are rectangularly formed to be similar to each other, while the opening areas are mainly adjusted to utilize the loading effect. However, it is alternatively possible to utilize the loading effect by setting the opening areas in the same sizes while adjusting the shapes.

For example, the openings may be formed as rectangles having the same areas, so that aspect ratios thereof are adjusted. The amount of etching is reduced as the aspect ratios (ratios of lengths of opposite sides in rectangles) are increased in the same opening areas. In general, it is possible to properly utilize the loading effect by optimizing both of the shapes and the areas of the openings.

(3) While the above embodiments have been described with reference to n-channel MOSFETs, the present invention can also be carried out similarly with respect to a p-channel MOSFET, to attain a similar effect.

(4) While the above embodiments have been described with reference to MOSFETs, the present invention is also applicable to an insulated gate semiconductor device such as an IGBT, for example, other than the MOSFET.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating an insulated gate semiconductor device, comprising:

(a) a step of preparing a semiconductor substrate having a major surface and a p-n junction;

(b) a step of forming a gate electrode having a first opening on said major surface through an insulating film;

(c) a step of forming an electrical insulating protective film to cover said gate electrode and said first opening;

(d) a step of selectively carrying out dry etching on said protective film, thereby providing said protective film with a second opening being defined on said major surface inside said first opening;

(e) a step of selectively carrying out wet etching on said protective film with an etchant having substantially no etching action on said gate electrode, thereby providing said protective film with a third opening being defined on said gate electrode;

(f) a step of connecting a main electrode to said major surface through said second opening; and.

(g) a step of connecting a gate wire to said gate electrode through said third opening.

2. The method of fabricating an insulated gate semiconductor device in accordance with claim 1, wherein said step (d) comprises:

(d-1) a step of forming a resist film on said protective film, (d-2) a step of selectively removing a portion of said resist film covering a central portion of said first opening through photolithography, (d-3) a step of carrying out dry etching on said protective film after said step (d-2) by employing said resist film as a screen, and (d-4) a step of removing said resist film.

3. The method of fabricating an insulated gate semiconductor device in accordance with claim 2, wherein said dry etching is carried out through RIE.

4. The method of fabricating an insulated gate semiconductor device in accordance with claim 1, wherein said step (e) comprises:

(e-1) a step of forming a resist film on said protective film, (e-2) a step of selectively removing a portion of said resist film covering a prescribed portion of said gate electrode through photolithography, (e-3) a step of carrying out wet etching on said protective film after said step (e-2) by employing said resist film as a screen and employing an etchant having substantially no etching action with respect to said gate electrode, and (e-4) a step of removing said resist film.

5. The method of fabricating an insulated gate semiconductor device in accordance with claim 1, wherein said protective film substantially consists of the same material as said insulating film.

6. The method of fabricating an insulated gate semiconductor device in accordance with claim 5, wherein said semiconductor substrate consists of a semiconductor being prepared from a base material of silicon, each of said insulating film and said protective film substantially consisting of a silicon oxide.

7. The method of fabricating an insulated gate semiconductor device in accordance with claim 6, wherein said gate electrode substantially consists of polycrystalline silicon.

8. The method of fabricating an insulated gate semiconductor device in accordance with claim 7, wherein said etchant consists of a hydrofluoric acid substance.

9. The method of fabricating an insulated gate semiconductor device in accordance with claim 1, wherein said dry etching is carried out until said major surface is etched down in said step (d).

10. A method of fabricating an insulated gate semiconductor device, comprising: (a) a step of preparing a semiconductor substrate having a major surface and a p-n junction;

(b) a step of forming a gate electrode having a first opening on said major surface through an insulating film;

(c) a step of forming an electrical insulating protective film to cover said gate electrode and said first opening;

(d) a step of providing said protective film with a second opening being defined on said major surface inside said first opening;

(e) a step of providing said protective film with a third opening being defined on said gate electrode;

(f) a step of connecting a main electrode to said major surface through said second opening; and (g) a step of connecting a gate wire to said gate electrode through said third opening, dry etching being selectively carried out through a single resist pattern for simultaneously forming said second and third openings, shapes and areas of pattern portions for said second and third openings being so set in said resist pattern as to expose said major surface in said second opening simultaneously with or before exposure of said gate electrode in said third opening, said dry etching being stopped at a time of exposure of said gate electrode in said third opening.

11. The method of fabricating an insulated gate semiconductor device in accordance with claim 10, wherein said dry etching is carried out through RIE.

12. The method of fabricating an insulated gate semiconductor device in accordance with claim 10, wherein said protective film substantially consists of the same material as said insulating film.

13. The method of fabricating an insulated gate semiconductor device in accordance with claim 12, wherein said semiconductor substrate consists of a semiconductor being prepared from a base material of silicon, each of said insulating film and said protective film substantially consisting of a silicon oxide.

14. The method of fabricating an insulated gate semiconductor device in accordance with claim 13, wherein said gate electrode substantially consists of polycrystalline silicon.

15. The method of fabricating an insulated gate semiconductor device in accordance with claim 10, wherein said shapes and said areas of said pattern portions are so set as to expose said major surface in said second opening before exposure of said gate electrode in said third opening.

16. A method of fabricating an insulated gate semiconductor device, comprising:

(a) a step of preparing a semiconductor substrate having a major surface and a p-n junction;

(b) a step of forming a gate electrode having a first opening on said major surface through an insulating film;

(c) a step of forming an electrical insulating protective film to cover said gate electrode and said first opening;

(d) a step of providing said protective film with a second opening being defined on said major surface inside said first opening;

(e) a step of providing said protective film with a third opening being defined on said gate electrode;

(f) a step of connecting a main electrode to said major surface through said second opening; and (g) a step of connecting a gate wire to said gate electrode through said third opening, etching being selectively carried out through the same resist pattern for simultaneously forming said second and third openings, said etching being first carried out through dry etching, said dry etching being stopped immediately before exposure of said gate electrode in said third opening, thereafter said etching being carried out through wet etching.

17. The method of fabricating an insulated gate semiconductor device in accordance with claim 16, wherein said dry etching is carried out through RIE.

18. The method of fabricating an insulated gate semiconductor device in accordance with claim 16, wherein said protective film substantially consists of the same material as said insulating film.

19. The method of fabricating an insulated gate semiconductor device in accordance with claim 18, wherein said semiconductor substrate consists of a semiconductor being prepared from a base material of silicon, each of said insulating film and said protective film substantially consisting of a silicon oxide.

20. The method of fabricating an insulated gate semiconductor device in accordance with claim 19, wherein said gate electrode substantially consists of polycrystalline silicon.

21. The method of fabricating an insulated gate semiconductor device in accordance with claim 20, wherein said etchant consists of a hydrofluoric acid substance.

22. The method of fabricating an insulated gate semiconductor device in accordance with claim 16, wherein said dry etching is stopped when the thickness of said protective film in said third opening reaches a level in the range of about 0.01 µm to about 0.02 µm.

23. The method of fabricating an insulated gate semiconductor device in accordance with claim 16, wherein wet etching employing said resist pattern is additionally carried out in said etching in advance of said dry etching.

24. The method of fabricating an insulated gate semiconductor device in accordance with claim 23, wherein said semiconductor substrate consists of a semiconductor being prepared from a base material of silicon, each of said insulating film and said protective film substantially consisting of a silicon oxide, said gate electrode substantially consisting of polycrystalline silicon, said wet etching being additionally carried out in advance of said dry etching being carried out through an etchant consisting of a hydrofluoric acid substance.

25. The method of fabricating an insulated gate semiconductor device in accordance with claim 23, wherein said wet etching being additionally carried out in advance of said dry etching is stopped when the depth of said etching reaches a level in the range of about 0.01 µm to about 0.02 µm.

* * * * *